United States Patent [19]

Konishi et al.

[11] Patent Number: 4,701,875

[45] Date of Patent: Oct. 20, 1987

[54] HIGH SPEED CONVOLUTION ARITHMETIC CIRCUIT WITH MULTIPLE COUNTERS

[75] Inventors: Kazuo Konishi, Tokyo; Meisei Nishikawa, Musashino, both of Japan

[73] Assignee: Kabushiki Kaisha Toshiba, Kawasaki, Japan

[21] Appl. No.: 674,844

[22] Filed: Nov. 26, 1984

[30] Foreign Application Priority Data

Nov. 26, 1983 [JP] Japan .................................. 58-221409
Feb. 13, 1984 [JP] Japan .................................. 59-22756

[51] Int. Cl.⁴ ............................................ G06F 15/31
[52] U.S. Cl. .................................................. 364/728
[58] Field of Search ........................................ 364/728

[56] References Cited

U.S. PATENT DOCUMENTS 3,748,451  7/1973  Ingwersen ............................ 364/728
4,025,772  5/1977  Constant .............................. 364/728
4,063,082 12/1977  Nussbaumer ........................ 364/728
4,255,795  3/1981  Hechtenberg ....................... 364/728
4,573,136  2/1986  Rossiter .............................. 364/728

OTHER PUBLICATIONS

"All About PCM/Digital Audio", Musen to Jikken, Separate Volume, (Nov. 20, 1979), pp. 89–96 & 121–124.

Primary Examiner—David H. Malzahn
Attorney, Agent, or Firm—Finnegan, Henderson, Farabow, Garrett & Dunner

[57] ABSTRACT

A convolution arithmetic circuit has an accumulator to multiply two digital data sequences and add up the products. The sequences are stored in memories which cycle at the same rates and with different scales, the memory containing the multiplicand data being periodically updated.

13 Claims, 17 Drawing Figures

HIGH SPEED CONVOLUTION ARITHMETIC CIRCUIT WITH MULTIPLE COUNTERS

BACKGROUND OF THE INVENTION

This invention relates to a convolution arithmetic circuit for a digital signal processing system such as a digital filter.

In recent years, widespread use has been made of digital recording and playback units, such as PCM recorders or DAD (digital audio disc) players utilizing PCM (pulse code modulation) techniques, to enable audio equipment to have as high a fidelity as possible. FIG. 1 is a partial diagram of a digital recording and playback unit. An analog signal, such as an audio signal, is input through terminal 11 and low-pass filter 12 removes unwanted high-frequency components from that signal. The output of filter 12 is supplied to sample-hold circuit 13, which samples the analog signal at a sampling frequency prescribed for the unit (e.g., 44.1 KHz in the case of a DAD player), for conversion into a digital signal by A/D (analog to digital) converter 14. Digital processing circuit 15 adds an error correction code and digital modulation to the digitized signal which is then recorded on a recording medium 16 such as a tape or a disc.

The original digital signal is recovered by digital demodulation processing circuit 17 which demodulates the playback signal from recording medium 16 and performs error correction for errors resulting from, for example, defects in the recording medium 16. The digital signal is extracted as a continuous analog signal, i.e., the original audio signal, from the output terminal 20, after removing the high-frequency noise component by low-pass filter 19, and after step-wise conversion to an analog signal by D/A (digital to analog) converter 18.

When the analog signal is recovered by sampling using this digital recording and playback unit, high-frequency components biased about the sampling frequency are generated resulting in a high-frequency distribution near the upper limit of the original frequency band. Low-pass filter 19 must therefore have a steep filter characteristic to remove these components.

If a digital filter is interposed after the A/D converter 14 or before the D/A converter 18 to remove the high-frequency components in the digital signal stage, the filter characteristic of the low-pass filter 19 need not be so steep.

Generally, there are two operations for providing digital data with a filtering characteristic. One is in the frequency domain and the other is in the time domain. The former filtering operation is accomplished first by a fast Fourier translation (FFT) of an input digital data sequence x(t) in the time domain into digital data X(w) in the frequency domain. Then, by multiplying the digital data X(w) with a transmission function G(w) having a desired characteristic in the frequency domain, and finally by an inverse fast Fourier translation (IFFT) of the product $Y(w) = X(w) \cdot G(w)$, an output data sequence y(t) is generated in the time domain. This digital filtering operation, however, cannot take place in real time if the input digital data sequence x(t) occupies a relatively long time. Furthermore, the FFT and IFFT hardware required is very complicated and large.

Another filtering operation uses a convolution algorithm between the input data sequence in the time domain x(t) and an impulse response sequence g(i) (i=0, 1, ..., m). The convolution algorithm for this filtering operation is expressed as follows:

$$y(t) = \sum_i g(i) x(t - i)$$

where y(t) represents a filtered output digital data sequence.

Conventional circuit arrangements for performing the convolution algorithm are illustrated in FIGS. 2 and 3 and have been reproduced from a paper titled "FIR Filter and Digital Signal Processing," "Musen to Jikken, Separate Volume," issued on Nov. 20, 1979, pp. 89—96. The circuit shown in FIG. 2 is a basic arrangement for performing the convolution algorithm. In FIG. 2, input terminal 30 receives a digital data sequence x(t) which consists of a plurality of codewords (e.g., of 16 bits per word) obtained through an analog-to-digital (A/D) conversion of an analog signal at sampling frequence w. The sequence x(t) is given to a delay device 31 composed of N−1 delay elements $31_1$ through $31_{N-2}$, each imparting a delay time T equal to the sampling period $1/F_S$. The outputs x(t) to x(t−N+1) of the delay elements $31_1$ through $31_{N-1}$ are sent to multipliers $32_0$ through $32_{N-1}$ each having a corresponding filter coefficient g(i) (i=0, 1, ..., N−1) derived from a desired impulse response or frequency transfer function. The outputs of the multipliers $32_0$ through $32_{N-1}$ are sent to an adder 33 to give an output codeword sequence y(t). Such a structure achieves the required filtering characteristics by appropriately setting the coefficients g(i). The circuit shown in FIG. 2, however, requires a large number of delay elements and multipliers to calculate the convolution algorithm of higher order.

The circuit in FIG. 3 has been proposed for improving the basic circuit shown in FIG. 2, and includes memories for storing an input data sequence x(t) and a corresponding filter coefficient g(i). In FIG. 3, the set of coefficient data g(k), which are set beforehand, are stored in ROM 31. These coefficient data g(k) are sequentially read from addresses provided by address counter 34 and the coefficient data are fed to accumulator 33. The input signal x(t), which constitutes the other data sequence of the convolution arithmetic calculation, is supplied from the outside at the prescribed intervals. As shown in the drawing, the input signal x(t) may be applied to accumulator 33 through switch 35 or to a data input terminal DIN of a RAM (read/write memory) 36. Switch 35 determines whether input signal x(t) is fed to accumulator 33 directly or is read out from RAM 36. RAM 36 stores the input signal x(t) at certain prescribed times and is normally in a read mode to supply the stored input signals to accumulator 33 through gate 35. Both the designation of the operating mode (read/write) and the setting of an address for RAM 36 (via RAM Address Counter 34) are carried out by timing control circuit 32 which is usually operated by microcomputer software. The timing control circuit 32 also indicates the address of the ROM 31 via ROM Address Counter 37 and further controls the operation mode of RAM 36 and the timing of data from accumulator 33.

The calculation of $$y(t) = \sum_{k=0}^{m} g(2k)x(t-k)$$

will be considered to help explain the operation of the circuit shown in FIG. 3. First, timing control circuit 32 and counters 34 and 37 indicate the addresses to enable sequential output of the coefficient data g(2), g(4), ..., g(2m) stored in ROM 31 and of the input signals x(t−1), x(t−2), ..., x(t−m) stored in RAM 36 according to the proper correspondence between g(2k) and x(t−k). These data are supplied to accumulator 33 where corresponding elements of both sequences are successively multiplied and the products added. During this time, an $\overline{R/W}$ (designating read/write) signal from the timing control circuit 32 is at an L (low) level so RAM 36 is in a read-mode. The $\overline{R/W}$ signal is also applied to a select terminal (not shown) of the switch 35, so that the path of input signal x(t) from a external device is disabled.

Before timing control circuit 32 performs the above operation, or at a suitable time during its progress, the $\overline{R/W}$ signal changes to an H (high) level, putting the RAM 36 into a writemode and setting switch 35 to connect accumulator 33 to the external device so that the current input signal x(t) is fed to accumulator 33 and the RAM 36. Timing control circuit 32 simultaneously identifies the addresses of the ROM 31 and RAM 36 so that the coefficient data g(k) corresponding to the input signal x(t) is read out from ROM 31 and the latest input signal x(t) is stored in the prescribed address in RAM 36 ready for use in the next calculation. When the convolution algorithm $$y(t) = \sum_{k=0}^{n} g(2k)x(t-k)$$

has been performed, accumulator 33 outputs the result of its convolution calculation in response to an output control signal from the timing control circuit 32.

Thus, the conventional convolution arithmetic circuit involves storing, in prescribed locations in the memory, two sets of data relating to the convolution calculation between the input signal x(t) and the coefficient data g(k), and supplying these sequentially to an accumulator in accordance with a correspondence relationship, all these operations being controlled by microcomputer software.

The above conventional convolution arithmetic circuit has a certain flexibility in that it makes use of microcomputer software, but, if it were to be selected for a digital filter used in a DAD circuit, problems would arise regarding the processing speed of the microcomputer software rendering the convolution arithmetic circuit unable to cope with the data flow of the other signal processing systems.

This problem can have very dire consequences. Specifically, in a digital filter used in a digital recording and playback unit as described above, the input signal x(t) is sampled at the sampling interval before being inputted sequentially, so the convolution algorithm must be performed in real time. This causes higher order calculation since the sampling number of the coefficient data g(k) that are used in the convolution algorithm must be fairly large, due to the need to set a transmission function, i.e., a filter characteristic, for the digital filter that will enable it to deal with signals containing a large number of high-frequency components. Since, as mentioned above, all the address signals and operations must be controlled by the microcomputer software, the load on the central processing unit of a microcomputer becomes too great to carry out the arithmetical processing in a fixed time. Such problems increase as the complexity of the calculations increase, and these problems set limits on the signal processing capabilities that could be achieved in practice by convolution arithmetic circuits.

SUMMARY OF THE INVENTION

One object of the invention is a convolution arithmetic circuit suitable for a real-time processing of digital signals.

Another object of the invention is a convolution arithmetic circuit having a simple construction for setting different convolution formula for data to be calculated.

A convolution arithmetic circuit according to this invention comprises: a first memory that stores a first data sequence, and a second memory that stores a second data sequence determined from an input data signal; a scale of N counter providing a series of addresses for the first memory, where N is the number of elements in the first data sequence, a scale of N/a counter providing a series of addresses for the second memory, where a is an integer divisor of N indicating the increase in sampling frequency sequence; accumulating means for computing a sequence of products of corresponding elements of the first and second data sequences read from the first and second memories, respectively, and for determining the sum of those products; means for generating a control signal to alter the output of the second counter when the output of the first counter reaches a predetermined value such that the first and second counters cycle at different rates; means for generating an operation signal that specifies the operating mode, read and write, of the second memory; and means, responsive to the operation signal, to the second memory and the accumulator means, the multiplicand switching the input signal directly to the accumulating means.

DETAILED DESCRIPTION OF THE EMBODIMENT

Preferred embodiments of the present invention are described below with reference to the accompanying drawings. In the embodiments, it is assumed that coefficient data and multiplicand data in a convolution algorithm are both 16-bit signals, but they could be signals of any length.

Figure 4:
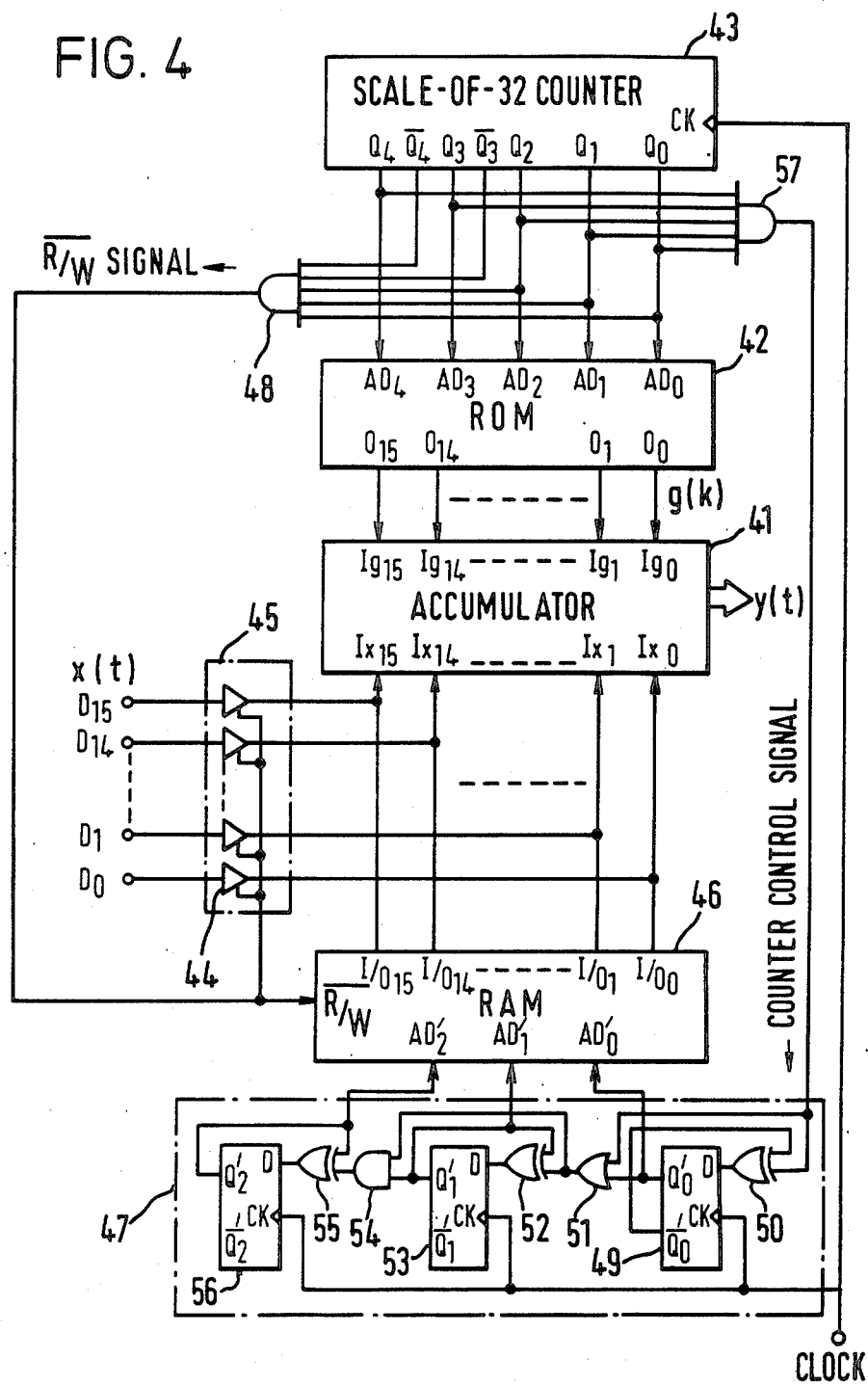
FIG. 4 is a circuit diagram of a first embodiment of a convolution arithmetic circuit according to this invention.

FIG. 4 shows a circuit configuration of an embodiment of a convolution arithmetic circuit according to this invention. In this embodiment, the sampling number (N) of the coefficients g(k) is set at 32. In FIG. 4, the input terminals Ig0 to Ig15 of accumulator 41 are connectd to output terminals 0 to 015 of ROM 42 that stores the coefficient data g(0) to g(31). Address input terminals AD0 to AD4 of ROM 42 are connected to output terminals Q0 to Q4 of a synchronous scale-of-32 counter 43. Input terminals Ix0 to Ix15 of accumulator 41 receive, with the prescribed timing, input signals x(t) (comprising data bits D0–D15) from an external device (not shown) through gate 45. Gate 45 includes 16 parallel tri-state buffers 44, each corresponding to a different bit of input signal X(t). The outputs of gate 45 are also connected to input/output (I/0) terminals I/00 to I/015 of RAM 46 which holds the input signals already stored in preceding stages. These signals constitute the multiplicand data. Address signals that are applied to the address input terminals, AD'$_0$ to AD'$_2$ of the RAM 46 are generated by a scale-of-8 variable counter 47 from its output terminals Q0' to Q2'.

An $\overline{R/W}$ signal that specifies the operating mode of RAM 46 is generated by a 5-input AND gate 48 whose five inputs are each connected to a different one of output terminals Q0–Q4 (or their complements) of scale-of-32 counter 43. The $\overline{R/W}$ signal thus generated and controlled is supplied to RAM 46 and gate 45. In one mode, the $\overline{R/W}$ signal permits the supply to RAM 46 and accumulator 41 of input signal x(t) at the input terminals of tri-state buffers 44.

The scale-of-8 variable counter 47 consists of three DFFs (D-type flip-flops) which together constitute a three-bit synchronous counter that counts according to the same clock signal CLOCK as scale-of-32 counter 43 described earlier. Exclusive OR gate 50 is coupled to the D input of the first DFF 49, and the output terminal $\overline{Q0'}$ of DFF 49 is coupled to the D input terminal of the DFF 53 by means of two-input OR gate 51 connected to an input of exclusive OR gate 52. The non-inverted output terminal of DFF 53 is connected to the D input terminal of DFF 56 through 2-input AND gate 54 and exclusive OR gate 53.

A counter control signal is applied to one terminal of exclusive OR gate 50, and the inverted output Q0' of DFF 49 is fed back to its D input terminal through exclusive OR gate 50. Two input OR gate 51 receives as its inputs the counter control signal and the non-inverted output $\overline{Q0'}$ of DFF 49. Exclusive OR gate 52 receives as its inputs the non-inverted output Q1' of DFF 53 and the output of 2-input OR gate 51. Two-input AND gate 54 receives as its inputs the output of 2-input OR gate 51 and the non-inverted output Q1' of DFF 53. Exclusive OR gate 55 receives as its inputs the non-inverted outputs Q2' of DFF 56 and the output of 2-input AND gate 54. DFFs 49, 53 and 56 are operated by the rising edge of the clock signal CLOCK, and the non-inverted outputs Q0'–Q2' provide the address signal for RAM 46.

The counter control signal is generated by the output of 5-input AND gate 57 connected to output terminals Q0–Q4 of scale-of-32 counter 43, and constitutes an enable signal for the scale-of-8 variable counter 47. The scale-of-8 variable counter 47 performs an ordinary counter operation, inverting outputs Q0' and $\overline{Q0'}$ of DFF 49 synchronously with clock signal CLOCK, while the counter control signal is at level L. However, when the counter control signal is at an H level, the scale-of-8 variable counter 47 holds the output level of DFF 49 and inverts the output level of DFF 53. Thus, while the count value of the scale-of-8 variable counter 47 is incremented by 1 with every clock signal CLOCK when the counter control signal is at an L level, when the counter control signal is at H level, the count of the counter control signal will be incremented by 2.

Figure 5:
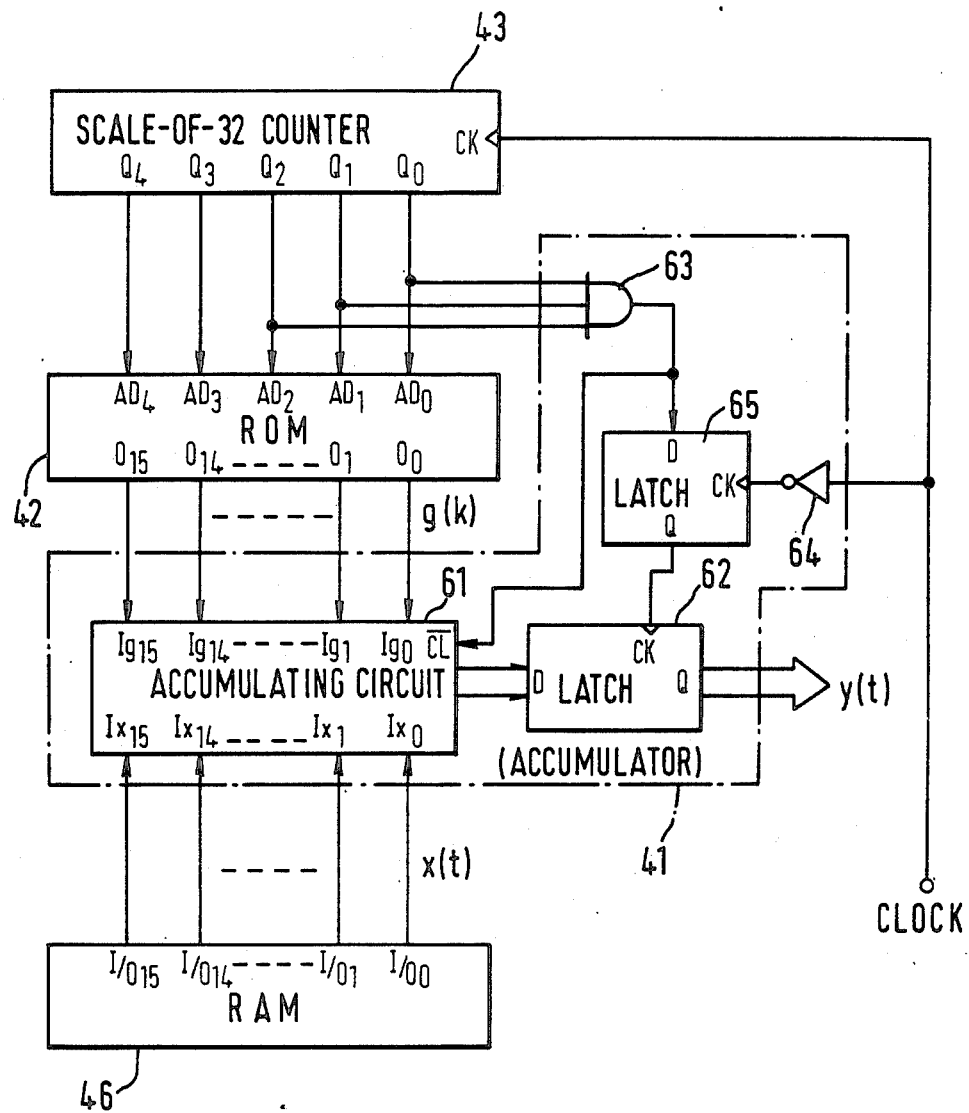
FIG. 5 is a circuit diagram showing the detailed configuration of a part of the convolution arithmetic circuit shown in FIG. 4.

Accumulator 41, shown in detail in FIG. 5, is equipped with an accumulating circuit 61, whose structural elements are multipliers and adders, and with a latch circuit 62 that latches an output of the accumulating circuit 61. Additionally, the accumulator 41 includes 3-input AND gate 63, which receives as inputs the three least-significant data bits of the scale-of-32 counter 43, and a latch circuit 65 that latches the output of the 3-input AND gate 63 with the rising edge of the CLOCK signal inverted by inverter 64. The latched output of 3-input AND gate 63 constitutes a clear signal CLEAR for accumulating circuit 61.

The output of accumulating circuit contains the sequential addition of the products of outputs g(k) from ROM 42 and outputs x(t) from RAM 46, and is cleared by the falling edge of the CLEAR signal.

Latch circuit 62 receives, as its data input, the output of the accumulating circuit 61 and, as its clock input, the Q output from latch circuit 65. The data that is latched in circuit 62 constitutes the output data y(t) of the convolution arithmetic circuit.

The operation of this embodiment will now be explained with reference to FIGS. 4–6. In this case, the convolution arithmetic circuit of FIG. 4 increases the effective sampling frequency by a factor of 4 by performing calculations defined by the following equations:

$$y(4t) = \sum_{j=0}^{7} g(4j)x(t-j)$$

$$y(4t+1) = \sum_{j=0}^{7} g(4j+1)x(t-j)$$

$$y(4t+2) = \sum_{j=0}^{7} g(4j+2)x(t-j)$$

$$y(4t+3) = \sum_{j=0}^{7} g(4j+3)x(t-j)$$

The convolution operation is executed four times while the input signal x(t) is sampled once, thereby making the effective sampling frequency of the output data y(t) four times the sampling frequency of the input signal x(t). Actually, the variable (4t+α) of the output data y(4t+α) (where α=0, 1, 2, 3) of the above equations is in the time domain, so the output data is, in fact, y((4t+α)/4) with respect to the input data x(t), although the variable is expressed for convenience in integer form, i.e., in the former form y(4t+α).

Figure 6:
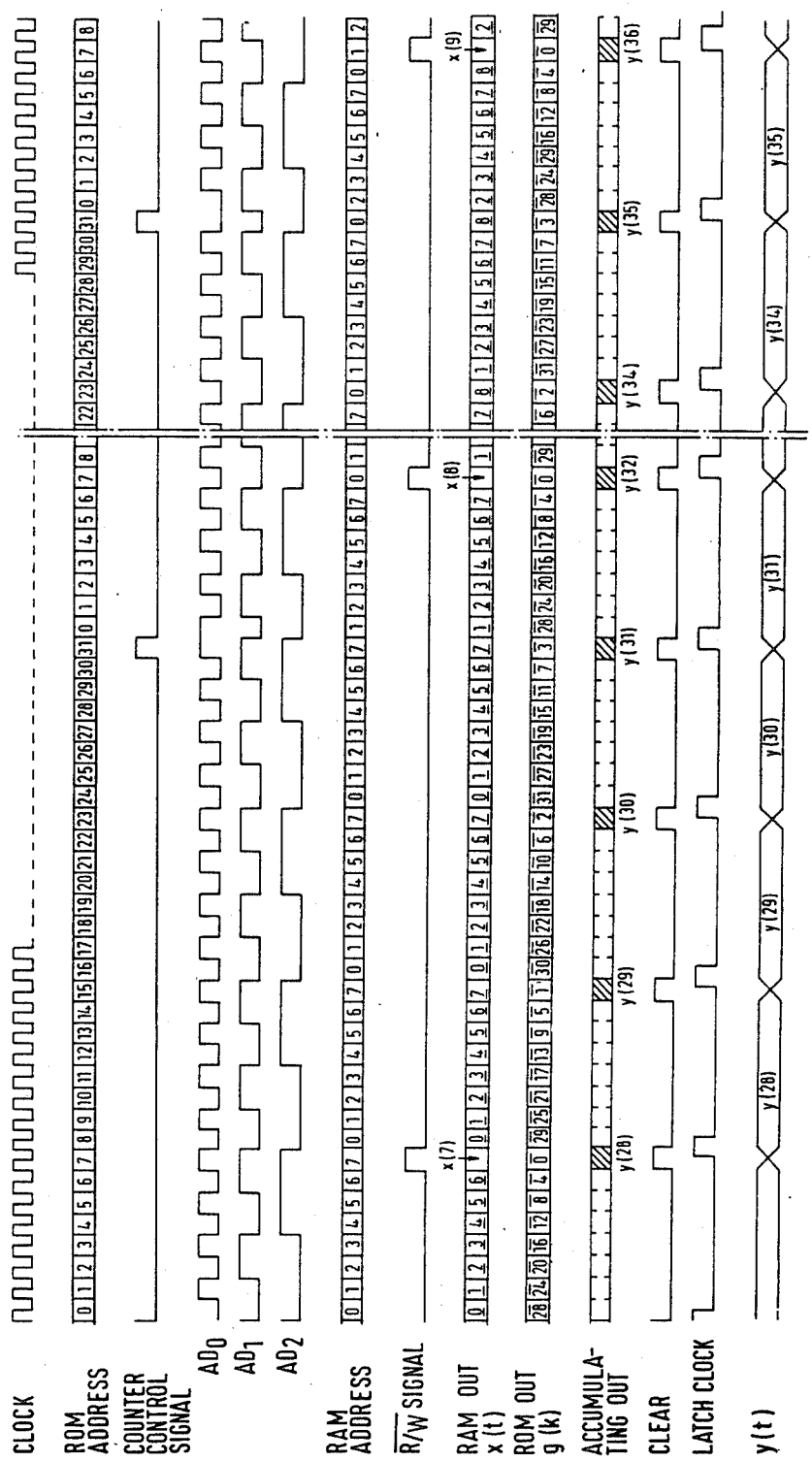
FIG. 6 is a timing chart to explain the operation of the first embodiment.

This convolution operation may be described using the time-chart shown in FIG. 6. The input signal from the stage of x(7) is partially omitted. Scale-of-32 counter 43 counts up synchronously with the rising edge of the input clock signal CLOCK and the address (ROM Address) for the ROM 42 changes from 0 ... 31, 0, 1, ... in accordance with the output of counter 43. With the same timing, the output of scale-of-8 variable counter 47 is applied to the address terminals AD'0 to AD'2 of the RAM 46 to change its address (RAM address) from 0 . . . 7, 0, 1, . . . . In this case, the coefficient data g(28), g(24), g(20), . . . , g(0) (expressed as $\overline{28}$, $\overline{24}$, $\overline{20}$, . . . , $\overline{0}$ in the line labeled "ROM out" in FIG. 6) are stored in ROM 42 at the ROM addresses 0-7, respectively, and are read out sequentially. The multiplicand data x(0)–x(6), expressed by 0–6, respectively, in FIG. 6 correspond to these coefficient data, and are stored in RAM 46 at addresses $\underline{0-6}$ and are read out from RAM 46.

Accumulator 41 finds the products of these coefficient data and multiplicand data and keeps a running total of the products. Accumulator 41 thus calculates g(28) x(0)+g(24) x(1)+g(20) x(2)+ . . . +g(4) x(6). The cumulative added output is sent from the accumulating circuit 61 to the latch circuit 62 in FIG. 4.

While the count of the scale-of-32 counter 43 is between "0" and "6," the $\overline{R/W}$ signal and the counter control signal are both at an L level. When the count of the scale-of-32 counter 43 reaches "7," H level signals are applied to all of the input terminals of the 5-input AND gate 48 and the $\overline{R/W}$ signal becomes an H level, causing RAM 46 to change to write-mode and gate 45, which was in the high impedance state, to allow the most recent input signal x(7) to be written in the RAM address "7" of the RAM 46.

Input signal x(7) is then supplied to accumulator 41 in place of the output of RAM 46, and the input signal x(7) is multiplied by the coefficient data g(0) corresponding to the ROM address "7." In this way, accumulator 41 makes the final calculation for the output data y(28) corresponding to input signal x(7).

When this calculation is completed, the accumulating output from the accumulating circuit 62 corresponds to $$y(28) = \sum_{j=0}^{7} g(4j)x(7 - j).$$

When the count of scale-of-32 counter 43 is "7," outputs Q0 to Q2, the three least-significant data bits of counter 43 all become "1" and 3-input AND gate 63 shown in FIG. 5 outputs an H level signal. At the falling edge of input clock signal CLOCK, i.e., the rising edge of the inverted clock signal from the inverter 64, latch circuit 65 transfers an H level clock signal (latch clock) to latch circuit 62, with a delay of onehalf the input clock signal's interval. Consequently, once the accumulating output y(28) has been determined, the latch circuit 62 latches that value, and outputs y(28) until the next latch clock. The output of 3-input AND gate 63 is then applied to a CLEAR terminal $\overline{CL}$ of the accumulating circuit 61, to clear that circuit on the falling edge of the CLEAR signal and prepare accumulating circuit 61 for the next calculation.

After the output data y(28) has been calculated, the $\overline{R/W}$ signal changes to an L level and RAM 46 returns to the read-mode. The read-mode continues until the count of the scale-of-32 counter 43 again becomes "7." When this happens, the RAM address again shifts from 0 to 7 by scale-of-8 variable counter 47, causing the multiplicand data x(0), x(1), x(2), . . . , x(7) corresponding to the RAM addresses to be read, the input signal x(7) in the preceding cycle having already been stored into RAM address "7." The corresponding coefficient data g(29), g(25), g(21), . . . , g(1) whose ROM addresses are the outputs 8–15 of the scale-of-32 counter 43 are outputted from the ROM 42, so accumulator 41 calculates g(29) x(0)+g(25) x(1)+g(21) x(2)+ . . . +g(1) x(7). When the count of scale-of-32 counter 43 is "15," i.e., when the outputs Q0 to Q2 of the three least-significant data bits of the scale-of-32 counter 43 again become all "1" (H level), the accumulating output is latched to hold the output data $$y(29) = \sum_{j=0}^{7} g(4j + 1)x(7 - j).$$

Accumulating circuit 61 is cleared by the falling edge of the CLEAR signal when the count of the scale-of-32 counter 43 shifts to "16".

These operations are carried out continuously. While the count of the scale-of-32 counter 43 is shifting from "16" to "23," the coefficient data g(30), g(26), g(22), . . . , g(2) corresponding to the ROM addresses 16–23, are read out from ROM 42, and the multiplicand data x(o)–x(7) are read out from RAM 46 in accordance with the address specified by the scale-of-8 counter 47. Accumulator 41 therefore calculates g(30) x(0)+g(26) x(1)+g(22) x(2)+ . . . g(2) x(7) with the same timing as in the preceding stage, and delivers the output data $$y(30) = \sum_{j=0}^{7} g(4j + 2)x(7 - j).$$

While the count of scale-of-32 counter 43 shifts from "24" to "31," the coefficient data g(31), g(27), g(23), . . . , g(3) at the ROM addresses corresponding to this current value are read out from ROM 42. These are supplied to the accumulator 41 in synchronism with the multiplicand data x(0), x(1), x(2), . . . , x(7) from RAM 46. Accumulator 41 performs the calculation g(31) x(0)+g(27), x(1)+g(23) x(2)+ . . . , g(3) x(7) to obtain output data $$y(31) = \sum_{j=0}^{7} g(4j + 3)x(7 - j).$$

At this time, all the coefficient data stored in ROM 42 will have been read out and, at the same time, the series of convolution calculations for which the input signal x(7) is the most recent multiplicand data will have been completed.

In the above convolution operation, when final scale-of-32 counter 43 is "31," outputs Q0 to Q4 from scaleof-32 counter 43 all have a "1" (H level) and, since they are applied to the output terminals of 5-input AND gate 57 shown in FIG. 4, the counter control signal which AND gate 57 outputs changes to an H level. Consequently, output of DFF 49 in scale-of-8 variable counter 47 is held for the following clock, as described earlier, and the output of DFF 53 is inverted, so the next RAM address is incremented by 2 with respect to the previous address and shifts from "7" to "1."

In the following convolution calculation, while the ROM address shifts from 0 to 7, the RAM address shifts through 1, 2, 3, ..., 7, 0. Further, when the count of the scale-of-32 counter 43 becomes "0", the $\overline{R/W}$ signal goes to an H level, and a fresh input signal x(8) is fed to RAM 46 and accumulator 41. Accumulator 41 therefore receives as its inputs the coefficient data g(28), g(24), g(20), ..., g(0) corresponding respectively to multiplicand data x(1), x(2), x(3), ..., and x(8). Accumulator 41 calculates g(28) x(1)+g(24) x(2)+g(20) x(3)+ ... +g(0) x(8), and delivers the output data $$y(32) = \sum_{j=0}^{7} g(4j)x(8-j).$$

For the succeeding calculations, the most recent input signal x(8) is stored in the RAM address "0" of RAM 46 in place of the oldest data x(0). Thus, the multiplicand data read out from RAM 46 are the input data successively stored when the count of the scale-of-32 counter 43 becomes "7."

After calculating the output data y(32) as above, the same sequence of operations occurs as when the series of convolution calculations were performed using the input signal x(7) as the data coefficient data from the corresponding ROM addresses. The corresponding RAM addresses are repeated in the cycle 1, 2, 3, ..., 7, 0 every time the convolution calculation is performed in each of the stages until the count of the scale-of-32 counter 43 again reaches "31." The coefficient data are therefore successively read out as x(1), x(2), x(3), ..., x(7), x(8). Accumulator 41 performs its convolution calculation with x(8) as the most recent multiplicand data, and determines $$y(33) = \sum_{j=0}^{7} g(4j+1)x(8-j),$$

$$y(34) = \sum_{j=0}^{7} g(4j+2)x(8-j),$$

and $$y(35) = \sum_{j=0}^{7} g(4j+3)x(8-j)$$

when scale-of-32 counter 43 reaches "15," "23" and "31," respectively.

When scale-of-32 counter 43 again becomes "31," the counter control signal changes to an H level and the RAM address shifts from "0" to "2". When the count of scale-of-32 counter 43 becomes "7," the $\overline{R/W}$ signal goes to an H level and the most recent data x(9) is written in the RAM address "1" in place of the oldest multiplicand data x(1). Subsequent operation is as already described. The RAM address shifts by 1 every time the input signal x(t) are successively received. The convolution algorithm is executed four times with the respective input signal constituting the most recent multiplicand data in each case.

Summarizing, an example of part of the convolution calculation performed in this embodiment is as given below:

$$y(28) = g(0)\,x(7) + g(4)\,x(6) + g(8)\,x(5) + \ldots +$$

$$g(24)\,x(1) + g(28)\,x(0);$$

$$y(29) = g(1)\,x(7) + g(5)\,x(6) + g(9)\,x(5) + \ldots +$$

$$g(25)\,x(1) + g(29)\,x(0);$$

$$y(30) = g(2)\,x(7) + g(6)\,x(6) + g(10)\,x(5) + \ldots +$$

$$g(26)\,x(1) + g(30)\,x(0);$$

$$y(31)\,g(3)\,x(7)\,g(7)\,x(6) + g(11)\,x(5) + \ldots +$$

$$g(27)\,x(1) + g(31)\,x(0);$$

$$y(32) = g(0)\,x(8) + g(4)\,x(7) + g(8)\,x(6) + \ldots +$$

$$g(24)\,x(2) + g(28)\,x(1);$$

$$y(33) = g(1)\,x(8) + g(5)\,x(7) + g(9)\,x(6) + \ldots +$$

$$g(25)\,x(2) + g(29)\,x(0);\ \text{etc.}$$

Figure 7:
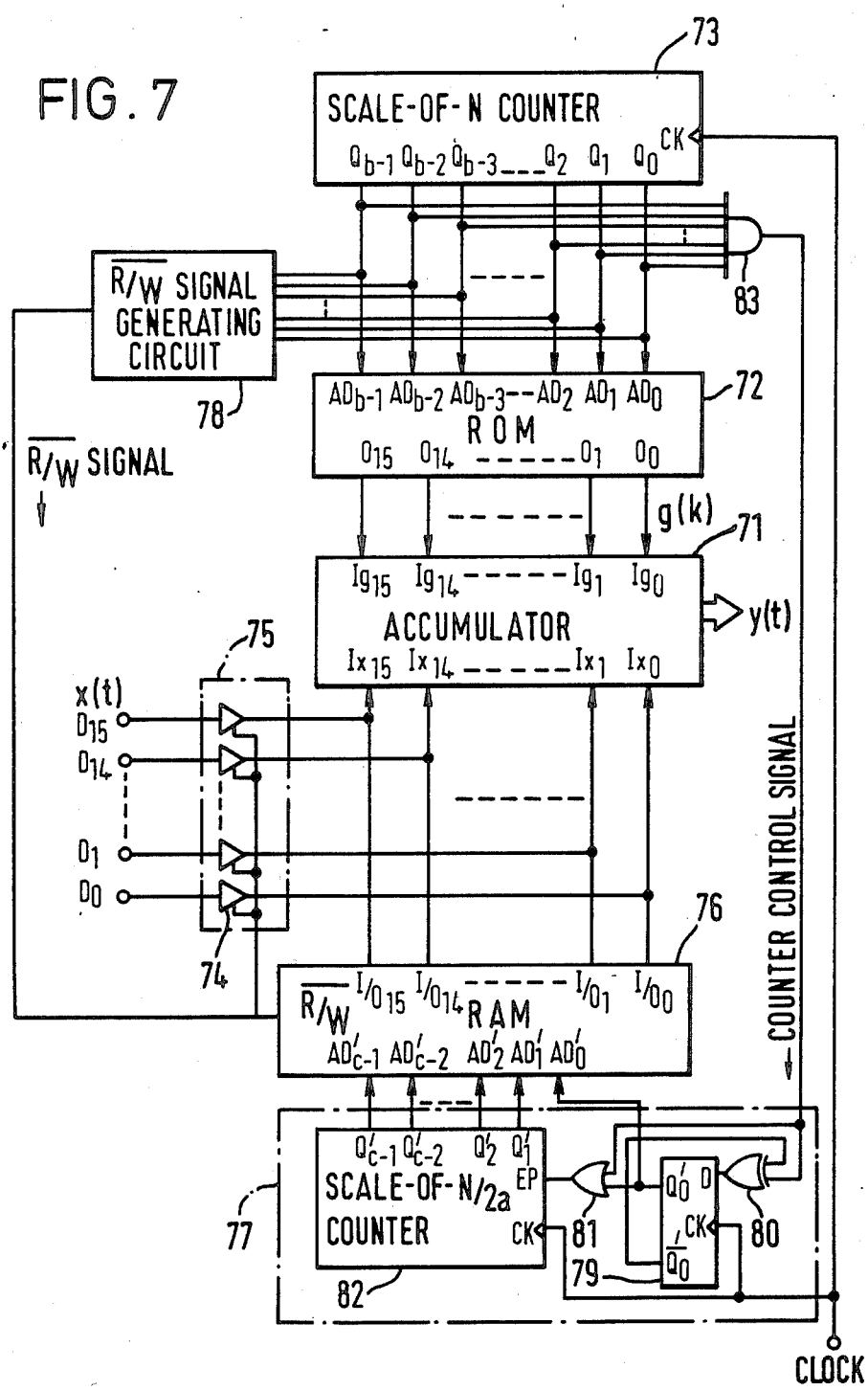
FIG. 7 is a circuit diagram of a second embodiment of a convolution arithmetic circuit according to this invention.

Another embodiment of the convolution arithmetic circuit of this invention will now be described. FIG. 7 shows the circuit configuration of a second embodiment of this invention. The second embodiment is a generalization of the first embodiment. The second embodiment consists of a convolution arithmetic circuit in which the sampling frequency is increased by a factor of a. The following description of the second embodiment will omit descriptions of parts which are identical in construction or function to corresponding parts in the first embodiment.

Address operation for ROM 72 that supplies N coefficient data g(k) to the accumulator 71 is performed by a scale-of-N counter 73. The input signals x(t) that constitute the multiplicand data are fed to RAM 76 and accumulator 71 at the appropriate time through the gate 75 which has sixteen tri-state buffers 74 arranged in parallel. The address operation for RAM 76 uses a scale-f-N/a variable counter 77 connected to the address terminals $AD'_0$ to $AD'_{c-1}$ of RAM 76. RAM 76 supplies to accumulator 71 the multiplicand data which have been stored durin the read-mode period of RAM 76 in response to the address signals outputted form the scale-of-N/a variable counter 77. $\overline{R/W}$ signal generating circuit 78 is connected to output terminals Q0 to Qb−1 of the scale-of-N counter 73. The R/W signal is fed to tri-state buffers 74 of gate 73 and to RAM 76 to control the acceptance of input signal x(t) and to set the operating mode of RAM 76.

Figure 1:
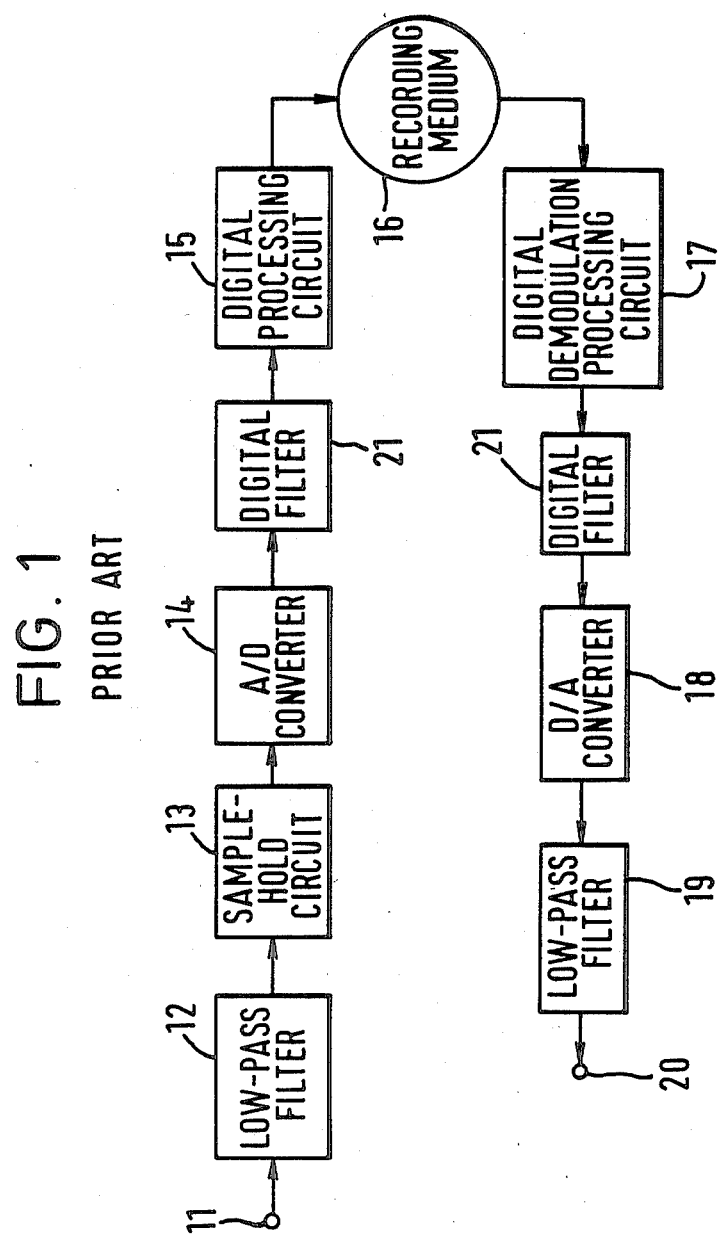
FIG. 1 is a block diagram of a conventional digital recording and playback unit.
Figure 2:
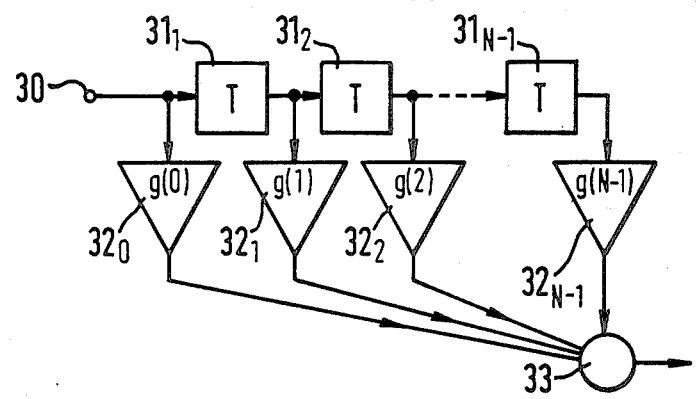
FIG. 2 and FIG. 3 are circuit diagrams showing conventional convolution arithmetic circuits.
Figure 3:
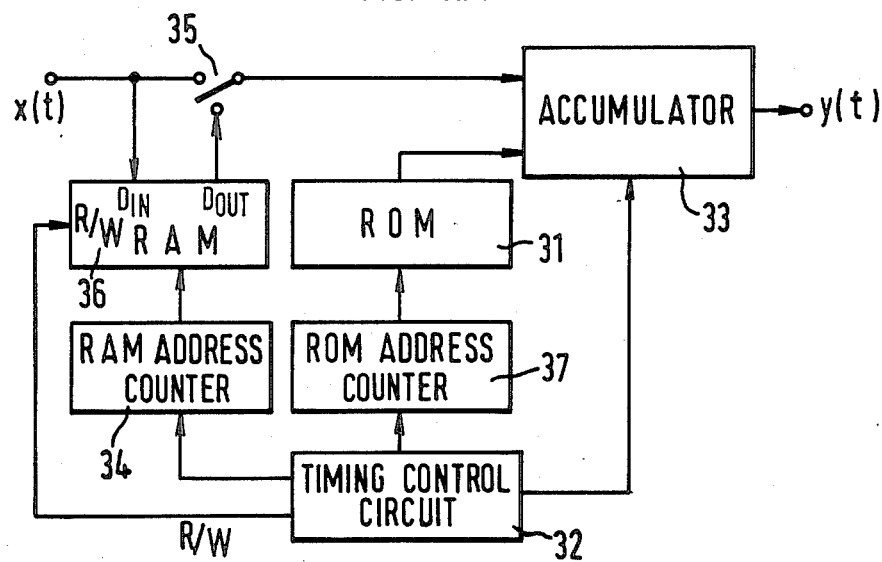

In the scale-of-N/a variable counter 77, exclusive OR gate 80 is coupled to an input of DFF 79 in the same way as in scale-of-8 variable counter 47 shown in FIG. 3. The inputs to exclusive OR gate 80 are the inverted output Q0′ of DFF 79 and the counter control signal. The non-inverted output Q0 of DFF 79 is supplied to address terminal AD0′ of the RAM 76 and to one input of OR gate 81, while the counter control signal is applied to the other input terminal of OR gate 81. The output of 2-input OR gate 81 constitutes an enable signal which is supplied to scale-of-N/2a counter 82 connected to the address terminals AD1′ to ADc−1′ of RAM 76.

The counter control signal is generated by AND gate 83 connected to the non-inverted outputs Q0 to Qb−1 of the scale-of-N counter 73. When the counter control signal becomes H level, i.e., when the count of the scale-of-N counter 73 is "N−1," the scale-of-N/a variable counter 77 is incremented by 2 with the succeeding clock signal.

The convolution arithmetic circuit according to FIG. 7 increases the sampling frequency by a factor of a using the N coefficient data. It executes repetitively in every sampling period of the input signal x(t) a series of "a" convolution calculations defined by the following equations:

$$g(at) = \sum_{j=0}^{m-1} g(aj)x(t-j)$$

$$g(at + 1) = \sum_{j=0}^{m-1} g(aj + 1)x(t-j)$$

$$g(at + 2) = \sum_{j=0}^{m-1} g(aj + 2)x(t-j)$$

$$g(at + m - 1) = \sum_{j=0}^{m-1} g(aj + a - 1)x(t-j).$$

In the above equations, m has been written instead of N/a. Thus the number of coefficient data and the number of multiplicand data used in the first convolution calculation became m respectively. The actual accumulation operation will now be explained with reference to the timing chart shown in FIG. 8. To make the FIG. 8 easier to understand, the drawing shows only the counter control signal, the $\overline{R/W}$ signal, the RAM address, which is the output from scale-of-N/a variable counter 77, and the ROM address which is the output from scale-of-N counter 73.

When the ROM address is "0," the RAM address is also "0." The RAM address repeats a times through the cycle 0, 1, 2, ..., m−2, m−1 while the ROM address increases from 0 to N−1. During this cycling time, except when the ROM address is m−1, RAM 76 is in the read-mode since the $\overline{R/W}$ signal is L level. The coefficient data and multiplicand data are supplied to accumulator 71 from ROM 72 and RAM 76. Accumulator 71 calculates the output data by performing a convolution algorithm every time the RAM address goes through a complete cycle, just as in the preceding embodiment.

When the ROM address is m−1, the $\overline{R/W}$ signal generated by the R/W signal generating circuit 78 changes to an H level, RAM 76 changes to the write-mode, and the high impedance state of gate 75 is released so that the input signal x(d) (d represents a fixed time) is written in RAM 76 and suppllied to the accumulator 71. At this time d, RAM 76 contains the multiplicand data stored in the preceding stage. The multiplicand data x(d−(m−1)), x(d−(m−2)), x(d−(m−3)), .., x(d) are stored in sequence at the RAM address 0, 1, 2, ... m−1. ROM 72 holds in ROM addresses 0−N−1, the coefficient data g(0) to g(N−1) in an order corresponding with the input data.

Figure 8:
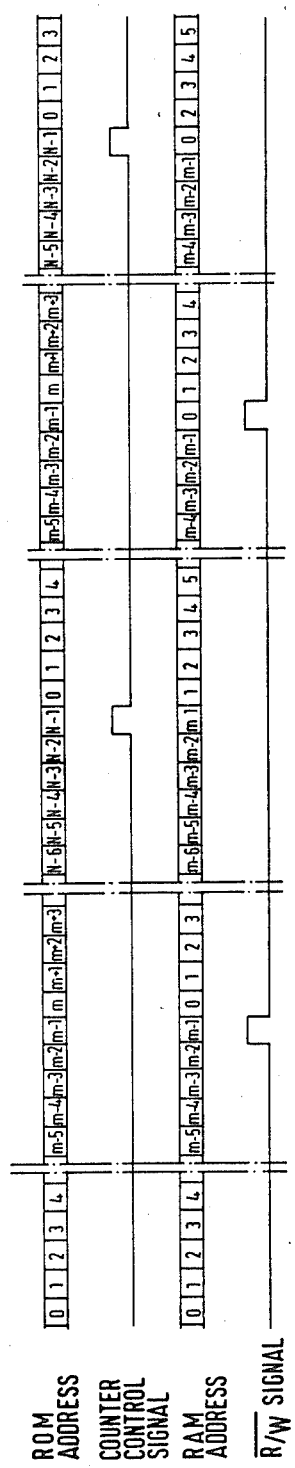
FIG. 8 is a timing chart to explain the operation of the second embodiment.

While the ROM address in FIG. 8 shifts from 0 to N−1, a series of convolution calculations ("a" times) are performed using these data. When the final ROM address N−1 is reached the counter control signal changes to an H level causing the RAM address to be incremented by 2 with the next clock signal (e.g., skipping 0 and starting from 1). Following this, the cycle is repreated, so the RAM address goes from 1, 2, ..., m−1, 0 a total of a times while the ROM address shifts from 0 to N−1. In this way, the RAM address corresponding to the ROM addresses are incremented by 1 as compared with the series of convolution calculations performed in the preceding stage. When, during this process, the ROM address is "m−1," the new input signal x(d+1) is written in the RAM ADDRESS "0" so that the oldest data x(d−(m−1)) of the previously stored multiplicand data is replaced by the newest multiplicand data x(d+1). Consequently, the input data that are multiplied with the coefficient data are respectively shifted to become the next data, x(d+1) being the most recent data. The data x(d−(m−2)), x(d−(m−3)), ..., x(d), x(d+1) are read out repetitively in this order and supplied to accumulator 71. Accumulator 71 executes a series of convolution calculations in which t in the foregoing definitions is replaced by d+1.

When the above operation is continued, after the series of convolution calculations of the second embodiment is completed, a series of convolution calculations are executed one after another, with the input signal providing the most recent multiplicand data, by incrementing the RAM address by 2, and, when the next calculation is performed, replacing the oldest multiplicand data by the newest input data.

In the second embodiment, which is a generalization of the first embodiment, a complicated convolution operation which increases the sampling frequency by a factor of "a" using a simple circuit configuration can be performed in the real-time domain. This is achieved by employing a scale-of-N/a variable counter to form the RAM addresses for a RAM in which the multiplicand data are stored, and by using a scale-of-N counter to form the addresses of a ROM in which the coefficient data are stored in a prescribed arrangement. Furthermore, by using the output of the scale-of-N counter to generate a counter control signal that controls the scale-of-N/a variable counter and an $\overline{R/W}$ signal that specifies the operating mode of a RAM, the circuit architecture can be made effective and the switching of the various signals can be achieved with accurate timing.

It should be noted that, in the above embodiment, the R/W signal is switched when the count of the scale-of-N counter is "m−1," and the switching of the counter control signal is set to occur when the count of the scale-of-N counter is "N−1," but the invention need not be so limited. For example, these signals could commence when a specified stage is reached in the series of convolution calculations. Alternatively, these signals could be determined by the correspondence of the ROM addresses with the coefficient data so that the counter control signal goes to H level when the final address is reached, the series of convolution calculations having been completed, and the $\overline{R/W}$ signal is at an H level when the address at which the oldest multiplicand data is stored is reached in the calculation following completion of a series of convolution calculations. In other periods, these signals would both be set on an L level.

Figure 9:
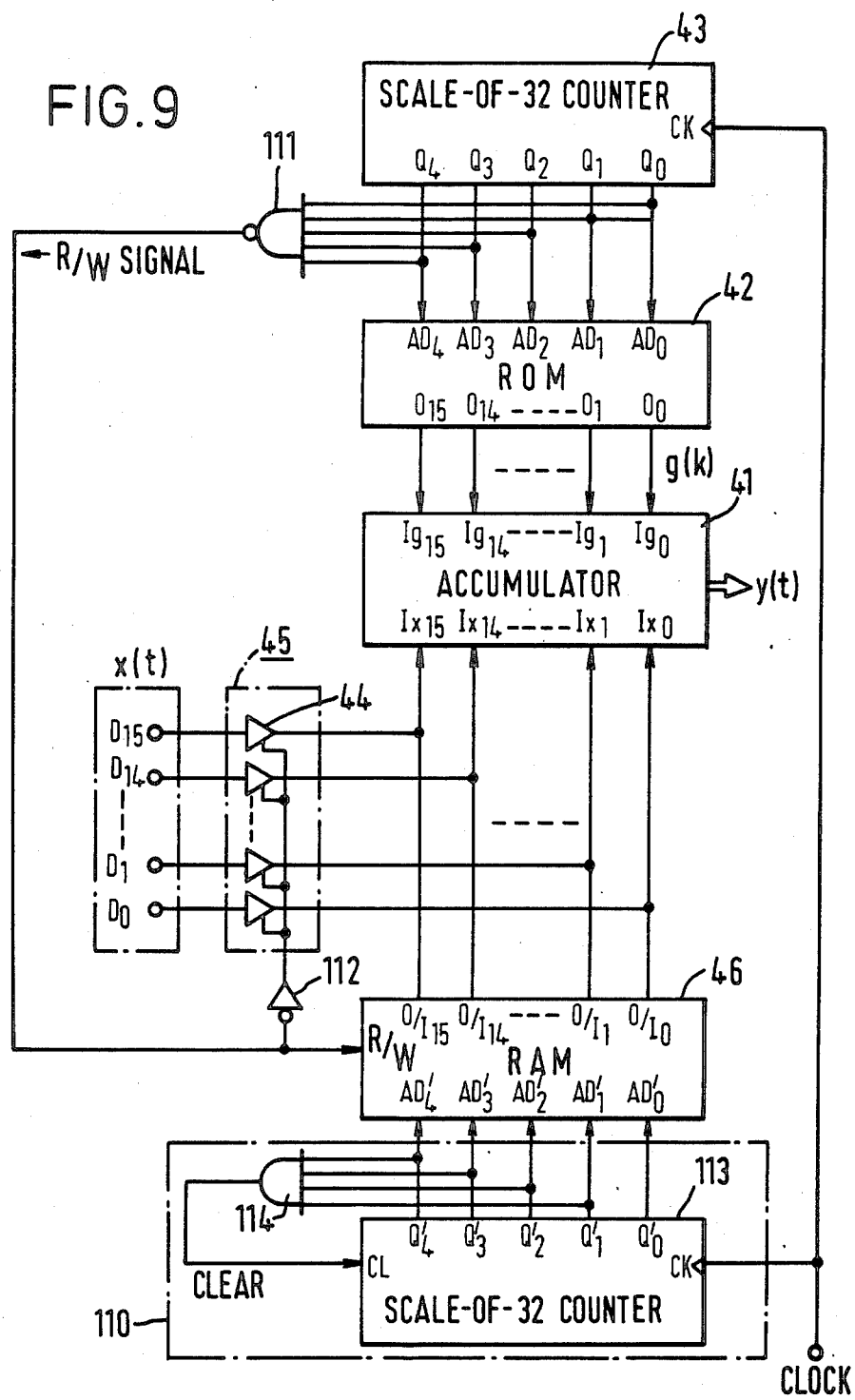
FIG. 9 is a circuit diagram of a third embodiment of a convolution arithmetic circuit according to this invention.

FIG. 9 shows a third embodiment of the convolution arithmetic circuit of this invention. In the description of this embodiment, parts which are identical in construction or function to corresponding parts in the first or second embodiments will not be described. Address operation for ROM 42 that supplies the coefficient data g(k) to the accumulator 41 is performed by a scale-of-32 counter 43. ROM 42 stores 16 coefficient data. The input signals x(t) that constitute the multiplicand data are fed to RAM 46 and accumulator 41 at the appropriate time through the gate 45 which has sixteen tri-state buffers 44 in parallel. The address operation for RAM 46 is performed by scale-of-31 counter 110 connected to the address terminals AD0' to AD4' of RAM 46. RAM 46 supplies to accumulator 41 the multiplicand data which have been stored during the read-mode period of RAM 46 in response to address signals from counter 110.

Five-input NAND gate 111 is connected to output terminals Q0 to Q4 of counter 43 and changes the R/W signal to an L level when the scale-of-32 counter 43 produces the ROM address 31. The R/W signal is fed to the tri-state buffers 44 of the gate 45 through an inverter 112 and to RAM 46 to control the transmission of input signal x(t) and set the operating mode of the RAM 46, respectively.

The scale-of-31 counter 110 comprises a scale-of-32 counter 113, like counter 43, and 4-input AND gate 114. Inputs of the AND gate 114 are connected to the non-inverted output terminals Q1' to Q4' and the output of AND gate 114 is connected to the clear terminal CL of the counter 113. Clock signal CLOCK is fed to the clock terminals of both the counters 43 and 113. The output of the AND gate 114 clears the scale-of-32 counter 113 when the noninverted outputs Q1' to Q4' of the scale-of-32 counter 113 have an H level shifting the count of the scale-of-32 counter 113 from "30" to "0". The scale-of-31 counter 110 thus acts like counter 47 in FIG. 3 or counter 77 in FIG. 7, in spite of not being connected to the address counter 43 for the ROM 42.

The operation of this embodiment will now be explained with reference to FIG. 9 and FIG. 10. First of all, we shall describe the case where a general convolution algorithm defined by $$y(t) = \sum_{k=0}^{31} g(k)x(t - k)$$

is performed during each sampling cycle of the input signal x(t). In this case, the convolution arithmetic circuit in FIG. 9 uses 5-input NAND gate 111 for generating the R/W signal. The coefficient data g(31), g(30), (29), ..., g(0) are stored, in that order, in ROM addresses 0, 1, 2, ..., 31, respectively, of the ROM 42.

Figure 10:
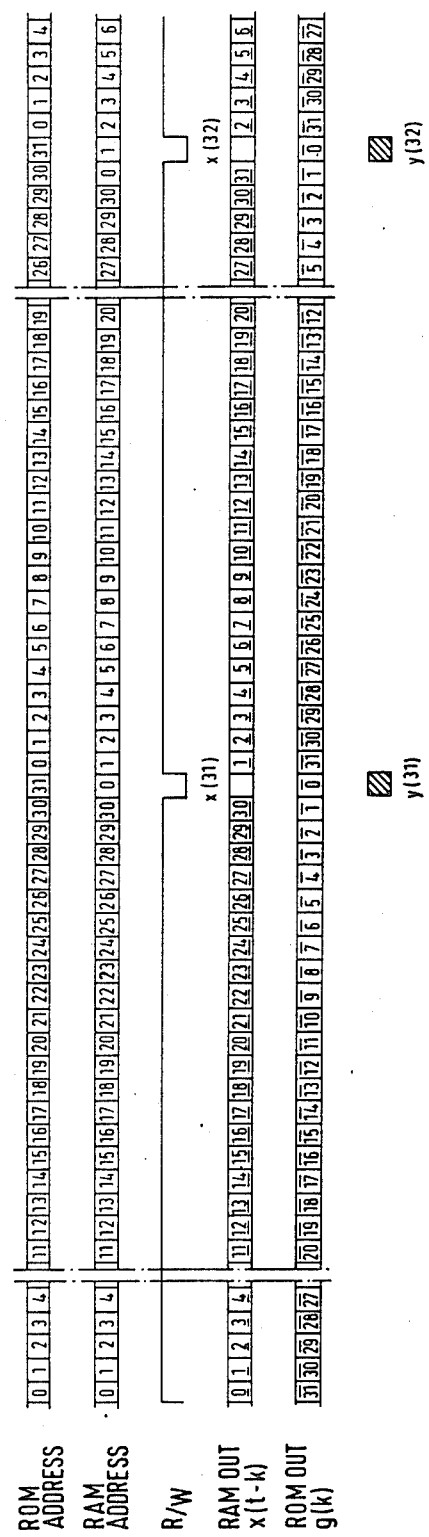
FIG. 10 is a timing chart to explain the operation of the third embodiment.

The flow of operations of this convolution arithmetic circuit is shown in FIG. 10. Since the scale of the counter 43 that controls the ROM address and the counter 113 that controls the RAM address are equal, during every cycle the ROM address shifts from "0" to "31", the RAM address would also pass through a complete cycle. However, when the ROM address reaches "30," the output of 4-input AND gate 114 changes to an H level to clear the scale-of-32 counter 113 and shift it to "0", causing the RAM address to be incremented by 2 with the next CLOCK signal, one cycle later. Then, when the ROM address is "31", the R/W signal also changes to an L level and, at this time, a new input signal x(t) is written into RAM 46. Consequently, when the RAM address is incremented by 2, the RAM outputs (multiplicand data) corresponding to the ROM outputs (coefficient data) are respectively shifted to the next data. This incrementing by 2 causes the last RAM address counted during the cycle to be skipped. When this occurs, the multiplicand data (oldest data) stored at that address is replaced by the most recent input signal x(t). Assuming the input signal presently applied to gate 45 is x(31), accumulator 41 adds the products of the multiplicand data x(0) through x(30) read out from the RAM 46 and the coeffecnt data read out from the ROM 42. The accumulating output is latched when the input signal x(31) is inputted from the gate 45 and when the coefficient data is g(31). That latched data, called y(31), as given by the equation:

$$y(31) = g(31)x(1) + g(30)x(2) + \ldots + g(1)x(30) + g(0)x(31)$$
$$= \sum_{k=0}^{31} g(k)x(31 - k)$$

After the convolution operation for output data y(31), the next input signal x(32) is applied to the gate 45 and the RAM address is incremented by 2. The multiplicand data read out from the RAM 46 are then x(2) through x(32) which, together with coefficient data g(31), g(30), ..., g(0), are supplied in order to accumulator 41, which calculates $$y(32) = \sum_{k=0}^{31} g(k)x(32 - k)$$

just as in the preceding step. Subsequently, the convolution arithmetic circuit calculates the output data y(33), y(34), ..., using the definition $$y(t) = \sum_{k=0}^{31} g(k)x(t - k)$$

given previously, using as the most recent multiplicand data x(t) the input signal x(33), x(34), ... every time it is entered.

When the above operation is continued after the series of convolution calculations of the third embodiment is completed, the series of convolution calculations are executed one after another with the input signal providing the most recent multiplicand data by incrementing the RAM address by 2 and, when the next calculation is performed, replacing the oldest multiplicand data by the newest input data.

Figure 11:
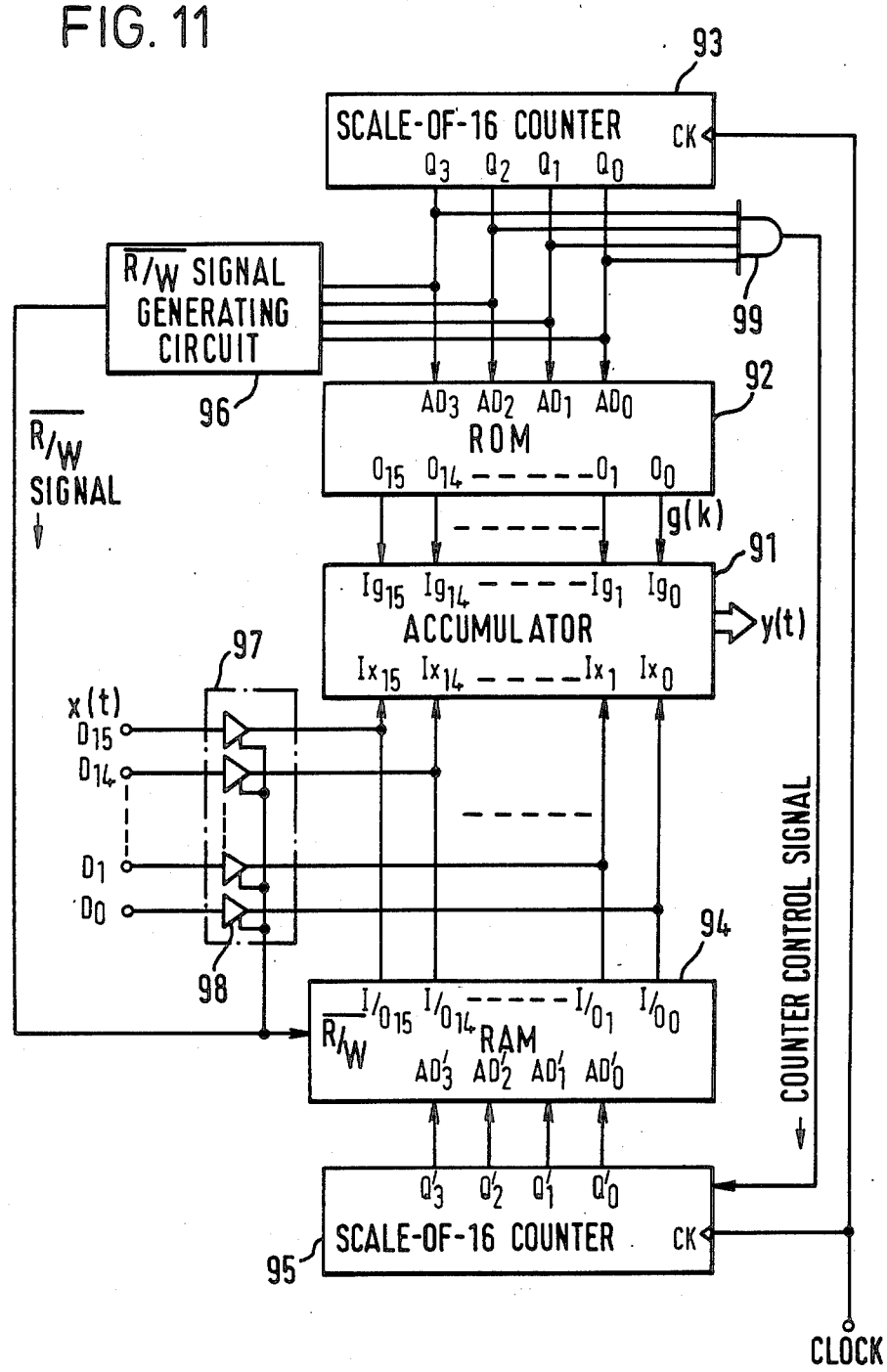
FIG. 11 is a circuit diagram of a fourth embodiment of a convolution arithmetic circuit according to this invention.
Figure 12:
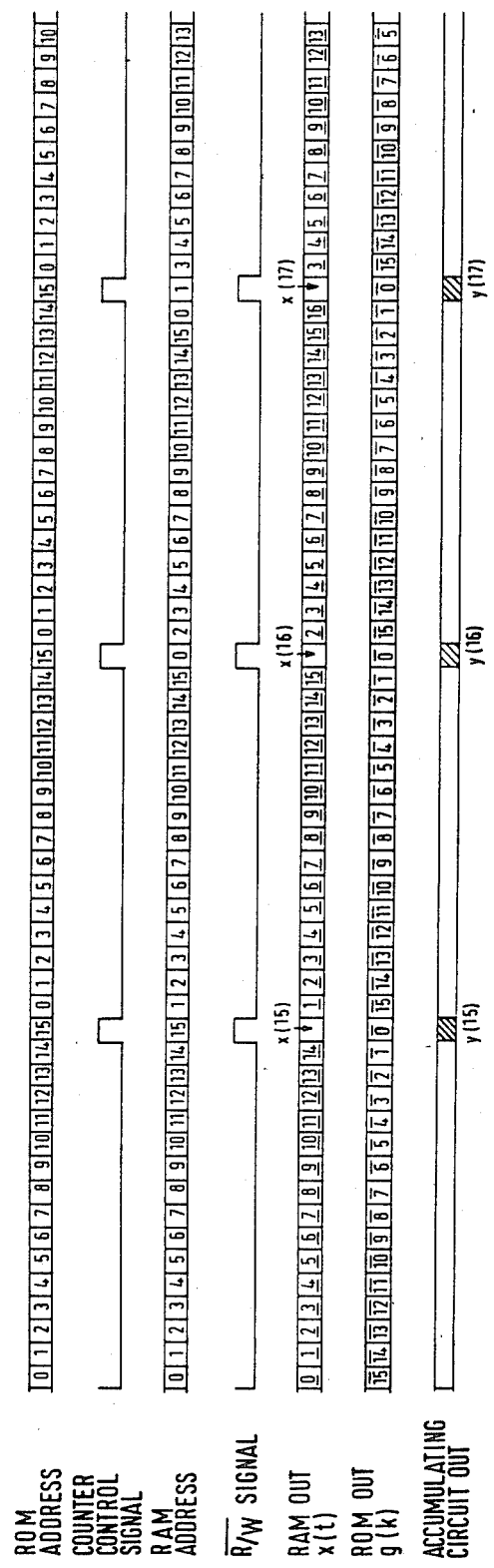
FIG. 12 and FIG. 13 are timing charts to explain the operation of the fourth embodiment.
Figure 13:
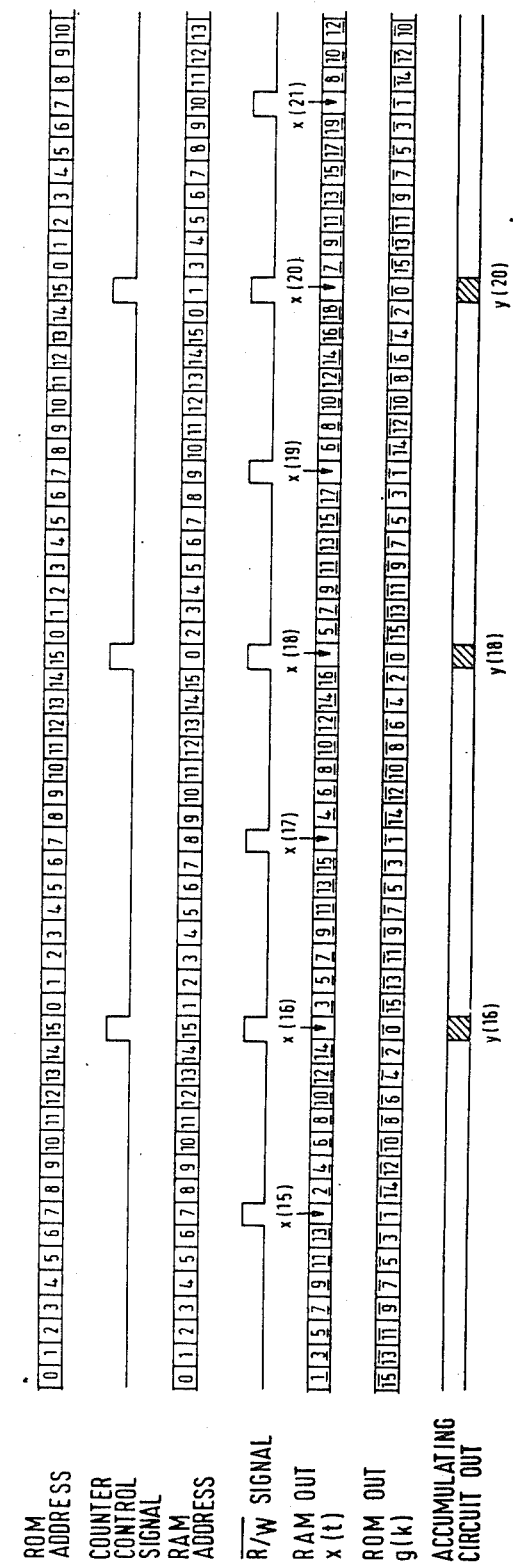

FIGS. 11 to 13 show a fourth embodiment of this invention. In the fourth embodiment, the convolution operation can either remain constant, or, in contrast to the preceding embodiments, be reduced by 1/a. In this embodiment, the number of coefficient data is 16. Consequently, as shown in FIG. 11, in the convolution arithmetic circuit of the fourth embodiment, the address operation for ROM 92 that supplies coefficient data g(0) to g(15) to accumulator 91 is performed by synchronous scale-of-16 counter 93. The address operation for RAM 94 that supplies multiplicand data is carried out by scale-of-16 variable counter 95.

An $\overline{R/W}$ signal generating circuit 96 is connected to the output terminals Q0 to Q3 of scale-of-16 counter 93. The $\overline{R/W}$ signal specifies the operating mode of RAM 94 and is applied to the "select" terminal of each tri-state buffer 98 in gate 97 to control the data flow to RAM 94 and accumulator 91 of input signal x(t). The counter control signal that effects a temporary increment (+2) of the output of variable counter 95 is generated by a 4-input AND gate 99 connected to the output terminals Q0 to Q3 of counter 93.

The configuration of accumulator 91 is practically the same as that of accumulator 41 of the first embodiment (shown in FIG. 5). However, in the present embodiment, the output of accumulator 91, taken as output data y(t), is latched when the count of the scale-of-16 counter 93 is "15".

A convolution arithmetic circuit of the above configuration can realize the various convolution algorithms to be described below by setting R/W signal generating circuit 96 to a desired state in accordance with the coefficient data previously stored in ROM 92. To describe the operation of this embodiment, the case where a general convolution algorithm defined by $$y(t) = \sum_{k=0}^{15} g(k)x(t-k)$$

is performed during each sampling cycle of x(t) will be considered. In this case, the convolution operation is performed without altering the sampling frequency and the R/W signal generating circuit 96 uses a 4-input AND gate as in the convolution arithmetic circuit of FIG. 8. The coefficient data g(15), g(14), g(13), ..., g(0) are stored, in that order, in ROM 92 at addresses 0–15. This $\overline{R/W}$ signal generating circuit 96 may also provide the function of 4-input AND gate 99 that generates the counter control signal.

The flow of operations of this convolution arithmetic circuit is shown in FIG. 12. Since the scale of counter 93 that controls the ROM address and the scale of variable counter 95 that controls the RAM address are equal, during every cycle of ROM address from "0" to "15," the RAM address also passes through a complete cycle. However, when the last RAM address is counted, i.e., when the ROM address reaches "15," the counter control signal changes to an H level, causing the RAM address to be incremented by 2 at the next clock cycle. Also, when the ROM address is "15", the $\overline{R/W}$ signal also changes to an H level and the new input signal x(t) is written into RAM 94.

When the RAM address is incremented by 2, RAM 94 multiplicand data are shifted since the incrementing causes the last RAM address counted in the cycle to be skipped. When this occurs, the multiplicand data (oldest data) stored at that last address is replaced by the most recent input signal x(t). If the input signal currently being applied to gate 97 is assumed to be x(15), accumulator 91 adds the products of multiplicand data x(0), x(1), ..., x(14) read out from RAM 94 with coefficient data read out from ROM 92. The accumulation output is latched when the input signal x(15) is inputted from gate 97 and the coefficient data is g(0). If this latched data is called y(15), then:

$$y(15) = g(0)x(15) + g(0)x(14) + \ldots \\ + g(14)x(1) + g(15)x(0).$$

After the convolution operation for output data y(15), the next input signal x(16) is applied to gate 97, and the RAM address is incremented by 2. The multiplicand data read out from the RAM 94 are therefore: x(1), x(2), ..., x(15), and multiplicand data x(1)–x(16) together with the coefficient data g(15)–g(0) are supplied to accumulator 91 for it to calculate $$y(16) = g(0)x(16) + g(1)x(15) + \ldots \\ + g(14)x(2) + g(15)x(1)$$

as in the preceding step. Subsequently, the convolution arithmetic circuit calculates the output data y(17), y(18), ... using the definition $$y(t) = \sum_{k=0}^{15} g(k)x(t-k)$$

given previously using the most recent multiplicand data x(t).

The convolution arithmetic circuit in FIG. 11 can also perform other operations. For example, the sampling frequency may be halved, as seen from the definition $$y(2t) = \sum_{k=0}^{15} g(k)x(2t-k),$$

so that the output data are obtained twice every sampling period of the input signal. The convolution algorithm defined by this equation means the convolution algorithm of the previous example is performed on alternate input data. In this case, R/W signal generating circuit 96 includes a 3-input AND gate circuit which operates on the three least significant bits of 16-bit counter 93. The output of that AND gate circuit provides the R/W signal which takes an H level when the count of counter 93 is "7" and "15." The coefficient data g(0) to g(15) are stored in the ROM addresses 0, 1, 2, ..., 15 of the ROM 92 in the correspondence relationship

| g(15 − 2α) | (when α = 1–7) |
| g(14 − 2(α − 8)) | (when α = 8–15) |

The flow of the operations of such a convolution arithmetic circuit is shown in FIG. 13. Every time the ROM and RAM addresses go through one cycle, the R/W signal changes to an H level twice at equal intervals (i.e., when the ROM address is "7" and "15"). This causes, in combination with the input signal sampling period (½ of the sampling period in the previous example), two input signal data to be written in the RAM 94 during each cycle of the RAM address. Also, one cycle later, the RAM address is incremented by 2 by the count control signal, and thereafter counts up by 1. The two RAM addresses where the new input signals are stored are respectively shifted from the storage addresses used during the previous calculation (e.g., "7" and "15") to the next addresses ("8" and "0"). The input signals that are thus stored in RAM 94 provide multiplicand data that are subsequently read out in sequence when the $\overline{R/W}$ signal has an L level. The input signals at gate 97, when the $\overline{R/W}$ signal is an H level, are directly inputted into accumulator 91.

If the input signal being applied to gate 75 is x(15), as shown in FIG. 13, coefficient data g(15), g(13), ..., g(1) are outputted corresponding to ROM addresses 0, 1, .. ., 7, and these coefficient data are fed to accumulator 91 together with multiplicand data x(1), x(3), ..., x(15). When the next input signal y(16) is subsequently applied to gate 97, the multiplicand data x(2), x(4), ..., x(16) are inputted to accumulator 91 together with the coefficient data g(14), g(12), ..., g(0) corresponding to ROM addresses 8, 9, ..., 15. The output of accumulator 91 obtained as a result of accumulation of these data is latched to provide output data y(16) determined by: Ps $$y(16) = g(15)x(1) + g(13)x(3) + \ldots \\ + g(1)x(15) + g(14)x(2) + g(12)x(4) + \ldots \\ + g(0)x(16)$$

By rearranging the right-hand side of this expression, the result is:

$$y(16) = g(0)x(16) + g(1)x(15) + \ldots \\ + g(14)x(2) + g(15)x(1)$$

which is the same as y(16) calculated by the convolution operation of the first example which did not alter the sampling frequency.

After thus calculating the output data y(16), the coefficient data are read out from ROM 92 as in the preceding cycle, and the multiplicand data are read out from RAM 94, but incremented by 1 in each case relative to the coefficient data. In addition, the new input signals x(17) and x(18) are accepted, so accumulator 91 now performs the calculation:

$$y(18) = g(15)x(3) + g(13)x(5) + \ldots \\ + g(1)x(17) + g(14)x(4) + g(12)x(6) + \ldots \\ + g(0)x(18).$$

The subsequent procedure is the same as that already described, with the convolution arithmetic circuit calculating the output data in accordance with the definition:

$$y(2t) = \sum_{k=0}^{15} g(k)x(2t - k)$$

given earlier every time two input signal data are accepted.

Such a convolution calculation, in which the sampling frequency is decreased by ½ is achieved by executing, on alternate input data, a convolution calculation in which the sampling frequency is unchanged. Thus, the output data of the intervening, omitted calculations represent unnecessary data. Usually when the sampling frequency is halved, respective output data are calculated as in the first example, every time new input signals are accepted, and alternate output data are then extracted. The convolution operation in this second example does not perform calculations which would cause unnecessary data, but instead, continuously calculates only the data that are actually required. This eliminates wasted time and enables arithmetic processing to be performed on the same order as in the first example, even on an input signal with a period ½ that of the input signal in the first example.

In these two examples, convolution arithmetic circuits have been described in which the sampling frequency is unchanged and in which it is halved. It is possible, based on the method illustrated in the second example, to decrease the sampling frequency by 1/a using suitable switching of the R/W signal and arrangement of the coefficient data in the ROM. In this case also, a convolution arithmetic circuit according to this invention can be made to perform real-time arithmetic processing without needing a complex configuration.

In the first, second and fourth embodiments, the scales of the counters forming the ROM addresses and the RAM addresses have been set in prescribed ratios. This makes it possible to design various convolution arithmetic circuits depending on their object, by switching the R/W signal and the counter control signal with prescribed timing.

In the previous three embodiments, the means for generating the R/W signal and the counter control signal are practically identical in construction. However, present technology provides various different methods which could be used and the invention is not restricted to the method of realization shown in these embodiments. Apart from this, the numerical values of the coefficient data or their output sequence can be altered. Furthermore, although in the above embodiments the counter control signal temporarily incremented the count of a counter by 2, this count alteration could be achieved by other means depending on the design of the counter in accordance with the calculations that are to be made.

Figure 14:
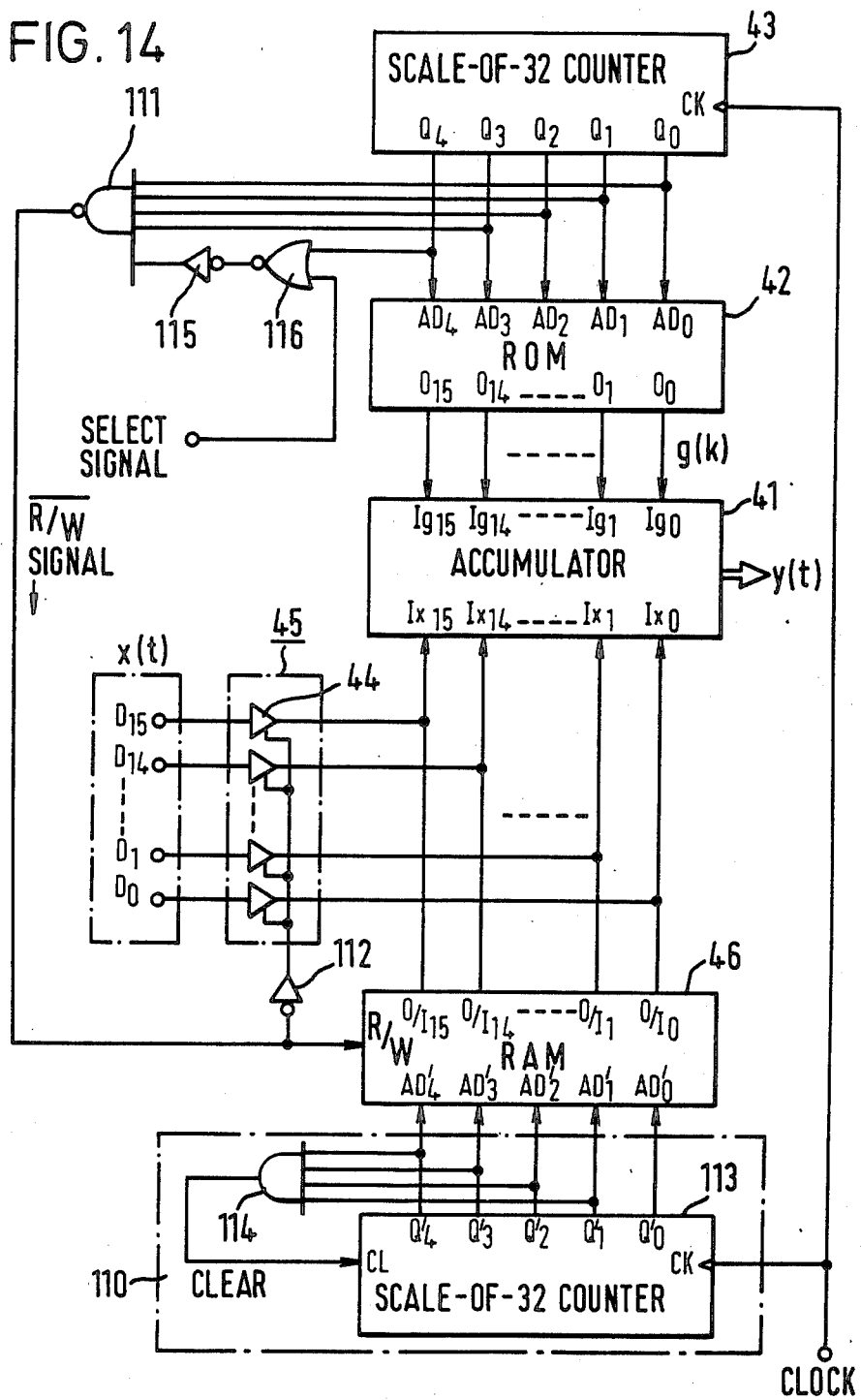
FIG. 14 is a circuit diagram of a fifth embodiment of a convolution arithmetic circuit according to this invention.

FIG. 14 shows a fifth embodiment of the convolution arithmetic circuit of this invention. In the fifth embodiment, the circuit arrangement is the same as that of the third embodiment shown in FIG. 9 except one input of the NAND gate 111 is connected to the non-inverted output terminal Q4, the MSB terminal of counter 43 through an inverter 115 and 2-input NOR gate 116. The other input of NOR gate 116 has a select signal. As before, a description of parts which are identical in construction or function to corresponding parts in the previous embodiments will be omitted.

The operation of this embodiment will now be explained with reference to FIGS. 14 and 15. A convolution arithmetic circuit of the configuration in FIG. 14 can realize two kinds of convolution algorithms by setting the select signal applied to an input of NOR Gate 116 to a desired state. If that the select signal is set to an L level, the circuit becomes equivalent with the circuit configuration of the third embodiment, i.e., the circuit of FIG. 9. As a result, the operation is the same as that of FIG. 9.

However, if the select signal is set to an H level, NAND gate 111 operates like a 4-input NAND gate whose four inputs are connected to the non-inverted output terminals Q0 to Q3, the four LSB data of counter 43. Then, the R/W signal from NAND gate 111 changes twice every cycle of the ROM address. As a result, the sampling frequency is reduced by ½ producing the convolution arithmetic operation defined by:

$$y(2t) = \sum_{k=0}^{31} g(k)x(2t - k),$$

and output data are obtained twice every sampling period of the input signal.

The convolution algorithm defined by that equation is performed on alternate input data. The coefficient data g(k), (k=0, 1, . . . , 31) are stored in the ROM addresses 0, 1, . . . , 31 of the ROM 42 in the following relationship:

| | |
|---|---|
| g(31 − 2α) | (when α = 0-15) |
| g(30 − 2(α − 16)) | (when α = 16-31) |

Figure 15:
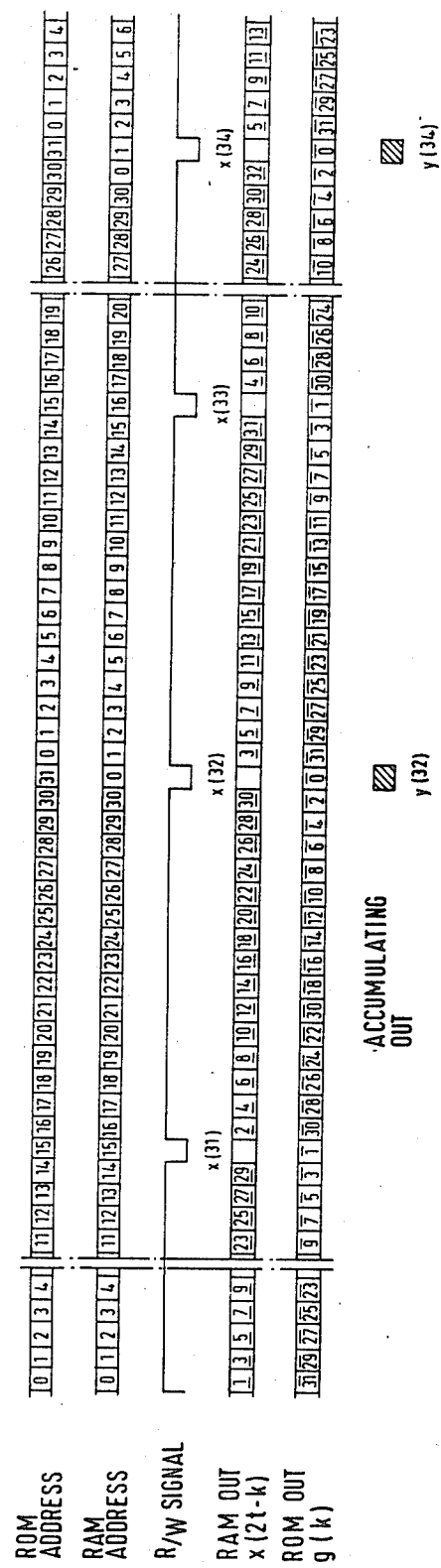
FIG. 15 is a timing chart to explain the operation of the fifth embodiment.

The flow of operations of such a convolution arithmetic circuit is shown in FIG. 15. Every time the ROM address goes through one cycle, the R/W signal changes to an L level twice at equal intervals (when the ROM address is b "15" and "31"), causing, in combination with the sampling period of the input signal which is reduced by ½, two input signal data to be written into RAM 46 during each cycle of the RAM address. Also, the RAM address is incremented by 2 one cycle later as explained in the third embodiment. The two RAM addresses where the new input signals are stored are respectively shifted from the storage addresses used on the previous occasion (e.g., "15" and "0") to the next addresses ("16" and "1"), which is caused by the scale of counter 110 count for the RAM address being one less than that of counter 43 for the ROM address. The input signals that are thus stored in RAM 46 provide the multiplicand data that are subsequently read out in sequence when the R/W signal is an L level. Accumulator 41 performs the calculations to produce the output data y(32) as expressed below.

$$y(32) = g(31)x(1) + g(29)x(3) + \ldots$$
$$+ g(1)x(31) + g(30)x(2) + g(28)x(4) + \ldots$$
$$+ g(0)x(32)$$

Similarly, the output data y(34), following y(32), is expressed by:

$$y(34) = g(31)x(3) + g(29)x(5) + \ldots$$
$$+ g(1)x(33) + g(30)x(4) + g(28)x(6) + \ldots$$
$$+ g(0)x(34),$$

which is the same as when the output data y(16) is calculated by the convolution operation of the first example in which the sampling frequency is unchanged. After thus calculating the output data, the coefficient data are read out from ROM 92 as in the preceding cycle, and the multiplicand data are read out from RAM 94, but incremented by 1 in each case relative to the coefficient data. In addition, the new input signals x(17) and x(18) are accepted, so accumulator 91 now performs the calculation:

$$y(18) = g(15)x(3) + g(13)x(5) + \ldots$$
$$+ g(1)x(17) + g(14)x(4) + g(12)x(6) + \ldots$$
$$+ g(0)x(18).$$

This embodiment is able to progress by changing the sampling frequency to $\frac{1}{4}$, $\frac{1}{8}$, or more by modifying the connection between the NAND gate 11 and the output terminals of counter 43 for the ROM address.

Figure 16:
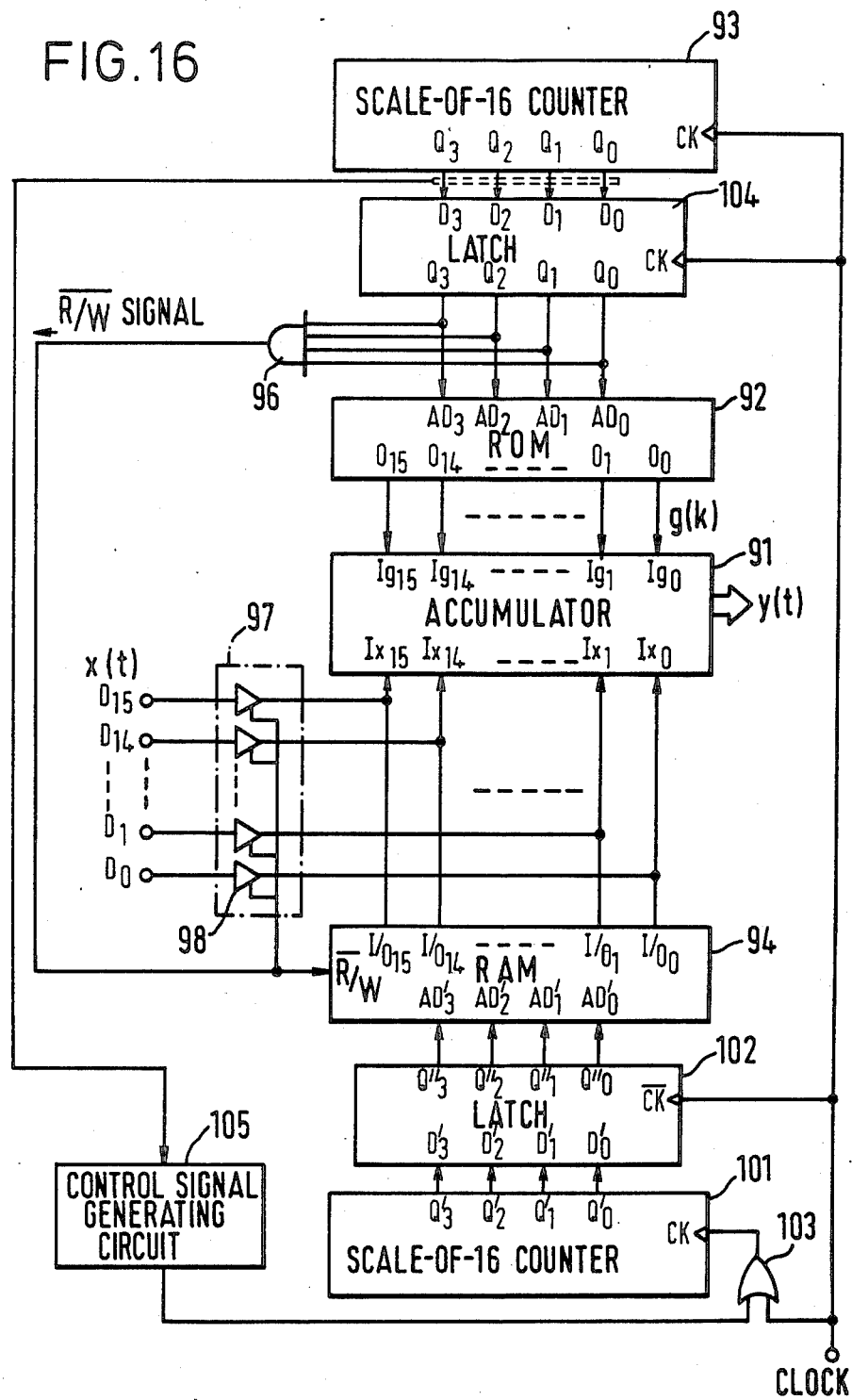
FIG. 16 is a circuit diagram of a sixth embodiment of a convolution arithmetic circuit according to this invention.
Figure 17:
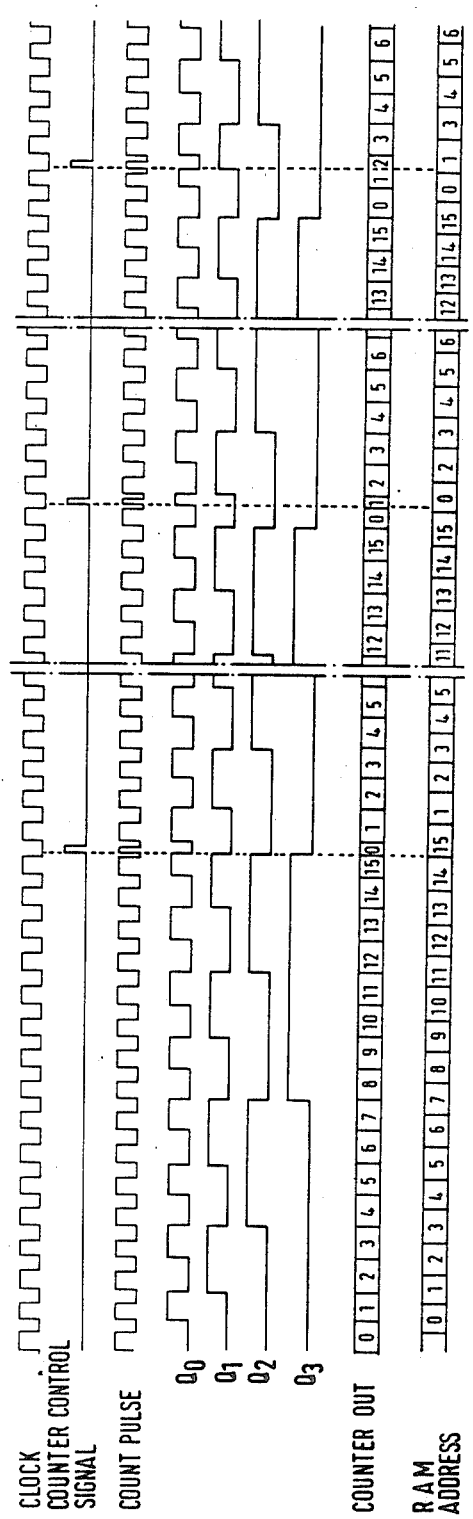
FIG. 17 is a timing chart to explain the operation of the sixth embodiment.

The sixth embodiment is explained using the first example described in explaining the fourth embodiment. The sixth embodiment uses another counting means to obtain the memory address of the multiplicand data, and uses a control means that temporarily alters the output of the count means. The circuit layout of the sixth embodiment is shown in FIG. 16, and FIG. 17 is a timing chart to explain the operation of FIG. 16.

In the following description of the sixth embodiment, parts which are the same as corresponding parts in FIG. 11 are given the same reference numerals and not described. In the convolution arithmetic circuit of the sixth embodiment, the means that specifies the address of RAM 94 comprises an ordinary synchronous scale-of-16 counter 101 and latch circuit 102 that latches the output of the counter 101. The output of the latch circuit 102 is the RAM address.

The scale-of-16 counter 101 has a two-input OR gate 103 connected to its clock terminal. A count pulse for the scale-of-16 counter 101 consists of the logical sum of the clock signal CLOCK and a counter control signal, both connected to the inputs of the two-input OR gate 103.

The convolution arithmetic circuit of the fourth embodiment also includes a latch circuit 104 between counter 93 and ROM 92 to synchronize the ROM address with the RAM address. Latch circuits 102 and 104 both latch data with the fall of the clock signal CLOCK.

The counter control signal is generated by control signal generating circuit 105. The control signal generating circuit 105 generates a pulse having a width less than the clock signal width when the count of counter 93 is "15" and between the falling edge of the clock signal and the next rising edge. This pulse is used as a counter control signal and may be generated, for example, by extracting a signal pulse at a constant interval (16 times the clock period) from a modified clock signal having a frequency four times the clock signal CLOCK and outputting the counter control signal with timing set by a delay circuit.

The actual operation of the embodiment in FIG. 16 will be explained with reference to FIG. 17. While the counter control signal is at an L level, the count pulse is identical with clock signal CLOCK at the clock terminal of counter 101 causing that counter to increment on the rising edge of CLOCK. The counter output at output terminals Q0' to Q3' of counter 101 shifts sequentially through 0, 1, 2, ..., 15. The counter output is latched at the falling edge of clock signal CLOCK by the latch circuit 102, and so is delayed by half the clock period before being used to provide the RAM address. Thus, the counter control signal changes to an H level when 16 pulses of the clock signal CLOCK have been counted i.e., after the fall of the 16th clock pulse, returning to an L level at the next clock singal rising edge.

Two count pulses therefore appear in the pulse period of the clock signal. The counter output of the scale-of-16 counter 101 therefore shifts from "15" to "0" during this time, becoming "1" on the rise of the next clock pulse. Since the latch circuit 12 latches the counter output on the rise of the clock signal, after the counter output "15" is latched, it skips "0" and latches "1" so the RAM address shifts from "15" to "1." Subsequent operation is the same as that already described. The counter control signal changes with a fixed period, so the RAM address in incremented by 2 after one cycle, following the same pattern as the RAM address in FIG. 12. The ROM address and the R/W signal are also developed as shown in FIG. 13 and the description of them will be omitted.

Thus in this embodiment, the same arithmetic processing can be achieved as in the first example of the fourth embodiment, further demonstrating that this invention may be realized many different ways.

As is clear from the above description of the first through the sixth embodiments, the convolution arithmetic circuit of this invention dispenses with the need for a microcomputer to control the convolution calculations in real-time. In spite of their hardware construction, these embodiments can be applied to various types of convolution calculation and thus have great practical value. Since the coefficient data that define the transfer function can be freely set, this convolution arithmetic circuit can be used not only in digital filters as described above, but also in various digital signal processing equipment such as echo machines, etc. Furthermore, the ROM for storing the coefficient data g(k) can be replaced by a RAM to allow the coefficient data g(k) to be rewritten easily in response to the various uses of the convolution arithmetic circuit.

As explained above, the convolution arithmetic circuit of this invention achieves effective control of the two sets of data sequences that take part in the convolution calculation using a comparatively simple circuit configuration, and is thereby very well adapted for real-time processing of the convolution operation.

What is claimed is:

1. A convolution arithmetic circuit for performing convolution processing on an input sequence composed of a series of values obtained at a sampling frequency, said convolution processing also using a response sequence composed of a predetermined number of elements, said convolution arithmetic circuit comprising:
   a first memory that store said elements of said response sequence in a predetermined order;
   a second memory means for storing that stores said input sequence values;
   a scale of N counter, response to a clock signal, said scale of N counter providing a first series of count values which serve as addresses for said first memory, where N is an integer indicating said predetermined number sequence elements in said response sequence;
   a scale of N/a counter, also responsive to said clock signal, for providing a second series of count values which serve as addresses for said memory, where a is an integer divisor of N chosen according to said sampling frequency; accumulating means, coupled to said first and second memories, for computing a sum of a series of products of elements of said response sequence from said first memory and corresponding values of said input sequence from said second memory; and
   control means, coupled to said scale of N counter, for generating a control signal to alter the order of the second series of count values provided by said scale of N/a counter.

2. The arithmetic circuit of claim 1 wherein said accumulating means includes:
   an accumulating circuit, coupled to said first and second memories, for computing said sum of said products, said accumulating circuits including a clear terminal for receiving a clear signal to reset said accumulating circuit to a zero value;
   a first latch circuit coupled to said accumulating circuit and including an input terminal, said first latch circuit storing said sum upon receipt of a store signal at said input terminal; and
   a gate circuit, coupled to said scale of N counter, for generating said store signal for said first latch circuit when said scale of N counter reaches a predetermined one of said count values and for generating said clear signal for said accumulating circuit when said scale of N counter reaches said predetermined one of said count values.

3. The arithmetic circuit of claim 2 wherein said gate circuit includes:
   an AND gate having an output and also having inputs coupled to outputs of said scale of N counter, said AND gate providing said clear signal at said output; and
   a second latch circuit coupled to said output of said AND gate for generating said store signal in response to said clock signal.

4. The arithmetic circuit of claim 1
   wherein said second memory includes
   first means for storing a first number of values of said input sequence, and
   second means for storing an additional value of said input sequence in response to a write signal, and
   wherein said arithmetic circuit further includes write means, coupled to said scale of N counter, for generating said write signal when said scale of N counter reaches selected ones of said count values.

5. The arithmetic circuit of claim 1 further including timing means, coupled to said scale of N counter, for generating a counter control signal when said scale of N counter reaches a predetermined one of said count values; and
   wherein said scale of N/a counter includes
      counting means for generating, in response to said clock signal, said series of count values as said addresses for said second memory; and
      reset means coupled to said timing means for causing said counting means to skip one of said series of count values in response to said counter control signal.

6. The arithmetic circuit of claim 5,
   wherein said first memory includes a ROM;
   wherein said second memory includes a RAM;
   wherein said timing means includes an AND gate having inputs coupled to said scale of N counter and an output providing said counter control signal at an output;
   wherein said counting means includes output terminals and a plurality of flip-flops for generating said count values at said output terminals; and
   wherein said reset means includes a plurality of logic elements connected between said plurality of flip-flops and coupled to receive said counter control signal.

7. The arithmetic circuit of claim 1 wherein said scale of N/a counter includes:
   a flip-flop coupled to receive said clock signal and said control signal and producing a first count value as a low order portion of said address for said second memory;
   logic circuitry means, coupled to receive said low order portion of said second memory address and said counter control signal, for generating a modified clock signal; and
   a scale of N/(2a) counter, coupled to said logic circuitry means and producing a high order portion of said second memory address in response to said modified clock signal.

8. A convolution arithmetic circuit for performing convolution processing on an input sequence composed of a series of values obtained at a sampling frequency, said convolution processing also using a response sequence composed of a predetermined number of elements, said circuit comprising:
   a first memory storing said elements of said response sequence in a predetermined order;
   a second memory storing said input sequence values;
   a first scale of N counter coupled to receive a clock signal, where N is an integer indicating said predetermined the number of said elements in said response sequence, said first scale of N counter providing a first series of count values which serve as addresses for said first memory;
   a second scale of N counter coupled to receive said clock signal and providing a second series of count values which serve as addresses for said second memory;
   accumulating means, coupled to said first and second memories, for computing a sum of a series of products of elements of said response sequence from said first memory and corresponding values of said input sequence from said second memory; and control means, coupled to said second scale of N counter, for generating a control signal to alter the order of said second series count values provided by said second scale of N counter.

9. The arithmetic circuit of claim 8
wherein said second scale of N counter includes
output terminals containing said second series of count values, and
a clear terminal for receiving a clear signal to reset the addresses at said output terminals to an initial state; and
wherein said count control means includes an AND gate having
input terminals connected to said output terminals of said second scale of N counter, and
an output terminal connected to said clear terminal of said second scale of N counter to provide said clear signal.

10. The arithmetic circuit of claim 9 wherein the number of said AND gate input terminals is one fewer than the number of said second scale of N counter output terminals, and wherein each of said input terminals of said AND gate is each connected to a different one of said output terminals of said second scale of N counter representing the higher order bits of said count values.

11. The arithmetic circuit of claim 8 further including write means, coupled to said first scale of N counter, for generating a write signal when said first scale of N counter reaches predetermined ones of said first series of count values, and write means including a selection circuit, responsive to a selection signal, for directing said write means to generate a write signal when at least one of said predetermined ones of said first series of count values has been reached.

12. The arithmetic circuit of claim 8 wherein each of said first and second scale of N counters includes a latch circuit, the latch circuit for said first scale of N counter being coupled to said first memory and storing said first series of count values addresses for said first memory, and the latch circuit for said second scale of N counter being coupled to said second memory and storing said second series of count values as addresses for said second memory.

13. The arithmetic circuit of claim 8 wherein said control means includes
a control generating cirucuit coupled to said first scale of N counter to receive said first series of count values, and
logic circuit means, coupled to receive both said clock signal and an output of said control generating circuit, for generating a modified clock signal for said second scale of N counter.

* * * * *